(12) United States Patent
Lablans

(10) Patent No.: US 8,103,943 B2
(45) Date of Patent: Jan. 24, 2012

(54) SYMBOL RECONSTRUCTION IN REED-SOLOMON CODES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 1300 days.

(21) Appl. No.: 11/743,893

(22) Filed: May 3, 2007

(65) Prior Publication Data
US 2008/0040650 A1    Feb. 14, 2008

Related U.S. Application Data

(60) Provisional application No. 60/821,980, filed on Aug. 10, 2006.

(51) Int. Cl.
*H03M 13/00*    (2006.01)
(52) U.S. Cl. .......................................... 714/784
(58) Field of Classification Search ............... 714/781, 714/784
See application file for complete search history.

(56) References Cited

U.S. PATENT DOCUMENTS

| | | | |
|---|---|---|---|
| 4,304,962 A | | 12/1981 | Fracassi et al. |
| 4,649,541 A * | | 3/1987 | Lahmeyer ..................... 714/784 |
| 5,297,153 A | | 3/1994 | Baggen et al. |
| 5,343,481 A | | 8/1994 | Kraft |
| 5,414,719 A * | | 5/1995 | Iwaki et al. ..................... 714/785 |
| 5,430,739 A * | | 7/1995 | Wei et al. ....................... 714/784 |
| 6,400,728 B1 * | | 6/2002 | Ott ................................. 370/465 |
| 6,634,007 B1 * | | 10/2003 | Koetter et al. ................ 714/784 |
| 6,665,831 B1 * | | 12/2003 | Yoshida et al. ................ 714/774 |
| 7,089,464 B2 * | | 8/2006 | Herley et al. .................. 714/712 |
| 7,203,893 B2 * | | 4/2007 | Kerr et al. ..................... 714/780 |
| 7,206,992 B2 | | 4/2007 | Xin |

OTHER PUBLICATIONS

Nolan, T.C.; Stark, W.E.; , "A recursive method for calculating error probabilities for a Reed-Solomon codeword with bounded distance errors and erasures decoding ," Military Communications Conference, 1998. MILCOM 98. Proceedings., IEEE , vol. 3, no., pp. 998-1002 vol. 3, Oct. 18-21, 1998 doi: 10.1109/MILCOM.1998.726998.*

Ta-Hsiang Hu; Shu Lin; , "An efficient hybrid decoding algorithm for Reed-Solomon codes based on bit reliability," Communications, IEEE Transactions on , vol. 51, No. 7, pp. 1073-1081, Jul. 2003 doi: 10.1109/TCOMM.2003.814212.*

Kunisa, A.; , "Symbol error probability for guided scrambling over a recording channel," Information Theory, 2002. Proceedings. 2002 IEEE International Symposium on , vol., no., pp. 298, 2002 doi: 10.1109/ISIT.2002.1023570.*

Hank Wallace, Error Detection and Correction Using the BCH Code, 2001, available from the Internet at www.aqdi.com/bch.pdf.

Bernard Sklar, Reed-Solomon Codes, available from the Internet at: http://www.informit.com/content/images/art_sklar7_reed-solomon/elementLinks/art_sklar7_reed-solomon.pdf.

* cited by examiner

*Primary Examiner* — Cynthia Britt
(74) *Attorney, Agent, or Firm* — Diehl Servilla LLC

(57) ABSTRACT

Symbol reconstruction methods by applying Galois Field arithmetic to Reed Solomon codewords have been disclosed. Reconstruction methods by applying n-valued reversing logic functions are also provided. A correct codeword can be selected from calculated codewords by comparing a calculated codeword with the Reed-Solomon codeword in error. A correct codeword can also be found by comparing a codeword in error with possible (p,k) codewords. Non Galois Field Reed Solomon coders are disclosed. Methods for correcting symbols in errors that have been identified as being in error are provided. Apparatus that implement the error correction methods are disclosed. Systems, including communication and storage systems that use the disclosed methods are also provided.

21 Claims, 11 Drawing Sheets

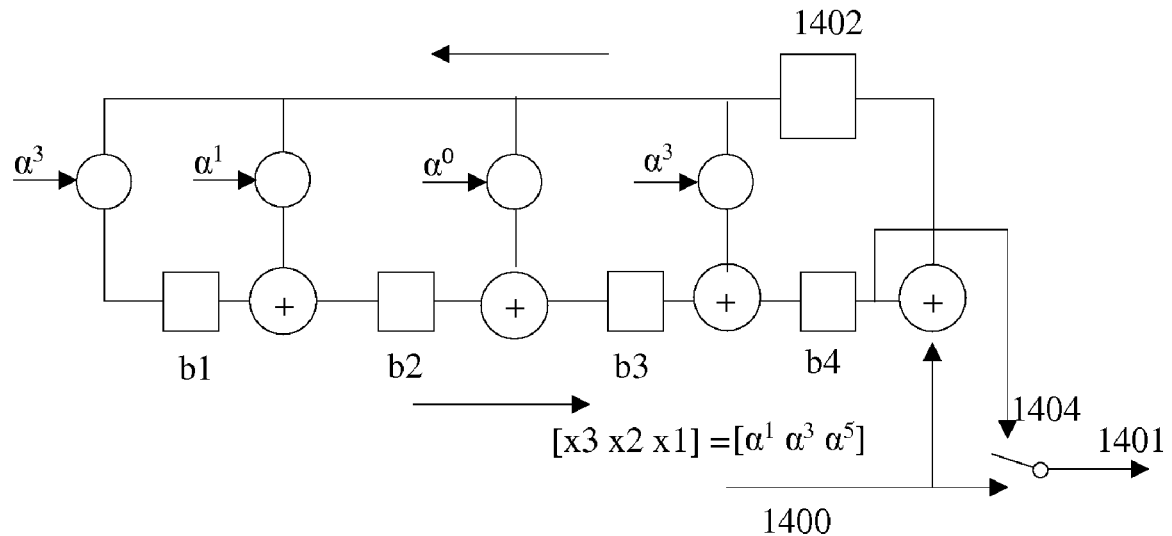

FIG. 14
PRIOR ART

| + | 0 | $\alpha^0$ | $\alpha^1$ | $\alpha^2$ | $\alpha^3$ | $\alpha^4$ | $\alpha^5$ | $\alpha^6$ |
|---|---|---|---|---|---|---|---|---|
| 0 | 0 | $\alpha^0$ | $\alpha^1$ | $\alpha^2$ | $\alpha^3$ | $\alpha^4$ | $\alpha^5$ | $\alpha^6$ |
| $\alpha^0$ | $\alpha^0$ | 0 | $\alpha^3$ | $\alpha^6$ | $\alpha^1$ | $\alpha^5$ | $\alpha^4$ | $\alpha^2$ |
| $\alpha^1$ | $\alpha^1$ | $\alpha^3$ | 0 | $\alpha^4$ | $\alpha^0$ | $\alpha^2$ | $\alpha^6$ | $\alpha^5$ |
| $\alpha^2$ | $\alpha^2$ | $\alpha^6$ | $\alpha^4$ | 0 | $\alpha^5$ | $\alpha^1$ | $\alpha^3$ | $\alpha^0$ |
| $\alpha^3$ | $\alpha^3$ | $\alpha^1$ | $\alpha^0$ | $\alpha^5$ | 0 | $\alpha^6$ | $\alpha^2$ | $\alpha^4$ |
| $\alpha^4$ | $\alpha^4$ | $\alpha^5$ | $\alpha^2$ | $\alpha^1$ | $\alpha^6$ | 0 | $\alpha^0$ | $\alpha^3$ |
| $\alpha^5$ | $\alpha^5$ | $\alpha^4$ | $\alpha^6$ | $\alpha^3$ | $\alpha^2$ | $\alpha^0$ | 0 | $\alpha^1$ |
| $\alpha^6$ | $\alpha^6$ | $\alpha^2$ | $\alpha^5$ | $\alpha^0$ | $\alpha^4$ | $\alpha^3$ | $\alpha^1$ | 0 |

FIG. 15
PRIOR ART

| × | 0 | $\alpha^0$ | $\alpha^1$ | $\alpha^2$ | $\alpha^3$ | $\alpha^4$ | $\alpha^5$ | $\alpha^6$ |
|---|---|---|---|---|---|---|---|---|
| 0 | 0 | 0 | 0 | 0 | 0 | 0 | 0 | 0 |
| $\alpha^0$ | 0 | $\alpha^0$ | $\alpha^1$ | $\alpha^2$ | $\alpha^3$ | $\alpha^4$ | $\alpha^5$ | $\alpha^6$ |
| $\alpha^1$ | 0 | $\alpha^1$ | $\alpha^2$ | $\alpha^3$ | $\alpha^4$ | $\alpha^5$ | $\alpha^6$ | $\alpha^0$ |
| $\alpha^2$ | 0 | $\alpha^2$ | $\alpha^3$ | $\alpha^4$ | $\alpha^5$ | $\alpha^6$ | $\alpha^0$ | $\alpha^1$ |
| $\alpha^3$ | 0 | $\alpha^3$ | $\alpha^4$ | $\alpha^5$ | $\alpha^6$ | $\alpha^0$ | $\alpha^1$ | $\alpha^2$ |
| $\alpha^4$ | 0 | $\alpha^4$ | $\alpha^5$ | $\alpha^6$ | $\alpha^0$ | $\alpha^1$ | $\alpha^2$ | $\alpha^3$ |
| $\alpha^5$ | 0 | $\alpha^5$ | $\alpha^6$ | $\alpha^0$ | $\alpha^1$ | $\alpha^2$ | $\alpha^3$ | $\alpha^4$ |
| $\alpha^6$ | 0 | $\alpha^6$ | $\alpha^0$ | $\alpha^1$ | $\alpha^2$ | $\alpha^3$ | $\alpha^4$ | $\alpha^5$ |

FIG. 16
PRIOR ART

| ÷ | 0 | $\alpha^0$ | $\alpha^1$ | $\alpha^2$ | $\alpha^3$ | $\alpha^4$ | $\alpha^5$ | $\alpha^6$ |
|---|---|---|---|---|---|---|---|---|
| 0 | 0 | 0 | 0 | 0 | 0 | 0 | 0 | 0 |
| $\alpha^0$ | 0 | $\alpha^0$ | $\alpha^6$ | $\alpha^5$ | $\alpha^4$ | $\alpha^3$ | $\alpha^2$ | $\alpha^1$ |
| $\alpha^1$ | 0 | $\alpha^1$ | $\alpha^0$ | $\alpha^6$ | $\alpha^5$ | $\alpha^4$ | $\alpha^3$ | $\alpha^2$ |
| $\alpha^2$ | 0 | $\alpha^2$ | $\alpha^1$ | $\alpha^0$ | $\alpha^6$ | $\alpha^5$ | $\alpha^4$ | $\alpha^3$ |
| $\alpha^3$ | 0 | $\alpha^3$ | $\alpha^2$ | $\alpha^1$ | $\alpha^0$ | $\alpha^6$ | $\alpha^5$ | $\alpha^4$ |
| $\alpha^4$ | 0 | $\alpha^4$ | $\alpha^3$ | $\alpha^2$ | $\alpha^1$ | $\alpha^0$ | $\alpha^6$ | $\alpha^5$ |
| $\alpha^5$ | 0 | $\alpha^5$ | $\alpha^4$ | $\alpha^3$ | $\alpha^2$ | $\alpha^1$ | $\alpha^0$ | $\alpha^6$ |
| $\alpha^6$ | 0 | $\alpha^6$ | $\alpha^5$ | $\alpha^4$ | $\alpha^3$ | $\alpha^2$ | $\alpha^1$ | $\alpha^0$ |

SYMBOL RECONSTRUCTION IN REED-SOLOMON CODES

CROSS-REFERENCE TO RELATED APPLICATIONS

This patent application claims the benefit of the priority of U.S. Provisional Application 60/821,980, filed on Aug. 10, 2006 which is incorporated herein by reference in its entirety.

BACKGROUND OF THE INVENTION

The present invention relates to error correcting coding and decoding. More specifically it relates to Reed-Solomon coding and decoding.

Error correction of digital codes is widely used in telecommunications and in transfer of information such as reading of data from storage media such as optical disks. Detection of errors can take place by analyzing symbols that were added to the information symbols during coding. The relation between information symbols and the added coding symbols is determined by a rule. If after reception of the symbols such relation between the symbols no longer holds, it can be determined that some of the symbols are different or in error compared to the original symbols. Such a relationship may be a parity rule or a syndrome relationship. If the errors do not exceed a certain number within a defined number of symbols it is possible to identify and/or correct these errors. Known methods of creating error correcting codes and correction of errors are provided by BCH codes and the related Reed-Solomon (RS) codes. These codes are known to be cyclic codes. Error-correction in RS-codes usually involves calculations to determine the location and the magnitude of the error. The calculations in RS-codes error correction can be time and/or resource consuming and may add to a coding latency.

Accordingly methods that can decode Reed-Solomon codes in a faster or easier way are required.

SUMMARY OF THE INVENTION

One aspect of the present invention provides a method for error correcting decoding a codeword generated as a (p,k) Reed-Solomon codeword comprised of p n-valued symbols of which k symbols are information symbols and having no more than (p−k)/2 symbols in error into a correct codeword by determining calculated codewords.

It is another aspect of the present invention to provide a method of error correcting decoding of a Reed Solomon codeword wherein calculated codewords are determined by applying Galois Field arithmetic operations in GF(n).

It is a further aspect of the present invention to provide a method of error correcting decoding a Reed Solomon codeword wherein the GF(n) is an extended binary field.

It is another aspect of the present invention to provide a method for error correcting coding of a Reed Solomon codeword wherein calculated codewords are determined by applying reversing n-valued logic functions.

It is a further aspect of the present invention to provide a method of error correcting decoding a Reed Solomon codeword wherein calculated codewords are determined in parallel.

It is another aspect of the present invention to provide a method for generating a Reed Solomon encoded (p,k) codeword of n-valued symbols by applying a k element n-valued LFSR in Fibonacci configuration wherein at least one feedback tap includes a reversible inverter not representing a GF(n) multiplier.

It is a further aspect of the present invention to provide a method for generating a Reed Solomon encoded (p,k) codeword of n-valued symbols wherein applied logic functions in an LFSR are equivalent to logic functions and multipliers and at least one reversible inverter not representing a GF(n) multiplier.

It is another aspect of the present invention to provide a method for correcting an error in a RS codeword when it is known which symbol in a codeword is in error.

It is a further aspect of the present invention to provide a method for generating a Reed Solomon encoded (p,k) codeword of n-valued symbols wherein the applied LFSR is an Galois equivalent of a Fibonacci LFSR that includes at least one reversible inverter not representing a GF(n) multiplier.

It is another aspect of the present invention to provide a method and apparatus for reconstructing a symbol in error by executing one or more n-valued logic expressions when the position of a symbol in error was previously determined.

It is a further aspect of the present invention to provide apparatus that implement the methods provided as aspects of the present invention.

It is another aspect of the present invention to provide systems that apply methods of error correction provided herein.

DESCRIPTION OF THE DRAWINGS

FIG. 14 is a diagram of a known Reed Solomon coder.

FIG. 15 is a truth table of an adder over GF(8).

FIG. 16 is a truth table of a multiplier over GF(8).

FIG. 17 is a truth table of an 8-valued division.

DESCRIPTION OF A PREFERRED EMBODIMENT

Reed-Solomon (RS) codes are often designated as (p,k) error-correcting codes. This means that a codeword consists of p symbols of which k symbols are the information or message symbols. The remaining (p−k) symbols are "overhead" symbols or check symbols to enable error correction. The "overhead" symbols in RS codes are generally remainder symbols generated by an LFSR. The LFSR used in RS coders are generally applied in Galois configuration. It is also possible to generate RS codes by using LFSRs in Fibonacci configurations.

In an earlier invention by the inventor as described in US Non-Provisional Patent Application entitled: ERROR CORRECTION BY SYMBOL RECONSTRUCTION IN BINARY AND MULTI-VALUED CYCLIC CODES, Ser. No. 11/739,189 and filed on Apr. 24, 2007 and which is incorporated herein by reference it was shown that (p,k) error correcting codes can be generated by LFSRs wherein a number of t errors can be corrected in a codeword when the codeword consists of k information or data symbols and 2*t+1 overhead symbols. The advantage of the coded method provided in the cited invention is that with using n-valued symbols one can generate an (p,k) code for error correcting t errors when p>n. This comes with the disadvantage that 1 more symbol has to be used than in a true RS-code. In a true RS-code the relation p−k=2*t applies.

While it may appear that using one more symbol than in RS-codes is a disadvantage, the method as provided in the cited patent application Ser. No. 11/739,189 also has advantages. For instance one of the constraints of an RS code over GF(q) is, according to the literature, that the codeword should have the same symbols or at least one symbol less than the logic wherein the code is developed. In other words: when one wants to develop an RS code in 7-valued logic, then the codeword should not be comprised of more than 7 7-valued symbols. The method provided by the inventor in patent application Ser. No. 11/739,189 does not have such a stringent constraint. As an example one can create a codeword of 11 symbols in a 5-valued logic using an LFSR with 6 elements. The codewords, using the appropriate functions, will have at most 6 symbols in common and thus may correct up to 2 symbol errors.

Figure 1:
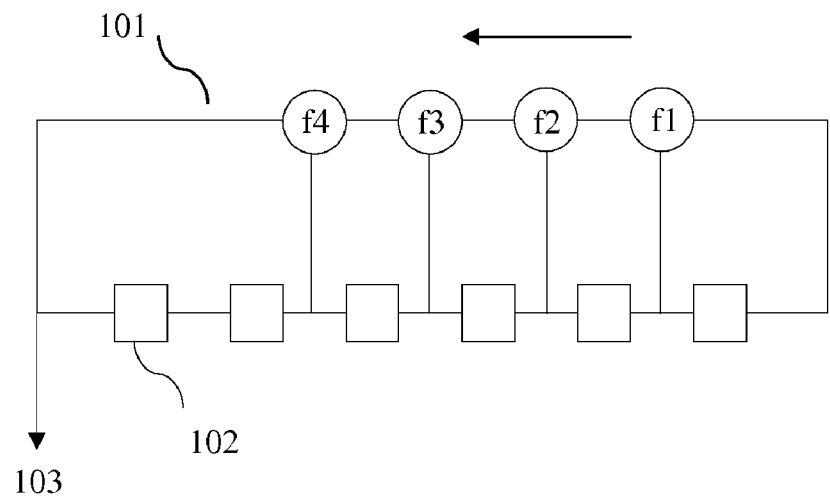
FIG. 1 is a diagram of an LFSR in Fibonacci configuration with no multipliers or inverters.
Figure 2:
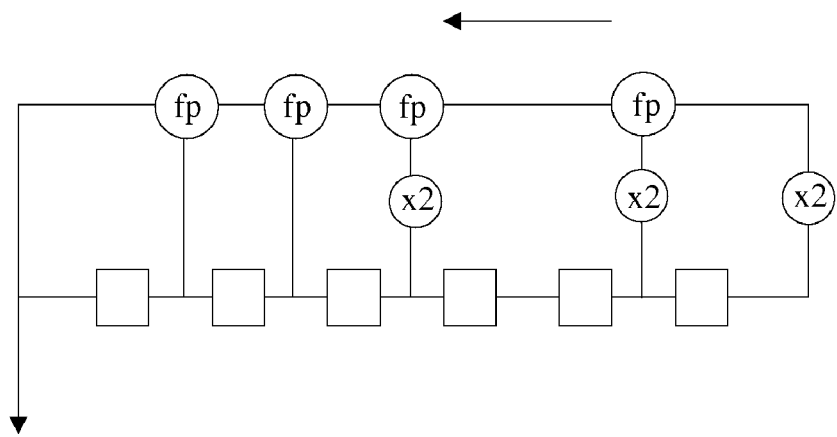
FIG. 2 is a diagram of an LFSR in Fibonacci configuration comprising multipliers.

One such code-generator configuration is shown in FIG. 2. This LFSR can generate a sequence of 15524 5-valued symbols. The multipliers are [1 1 2 0 2 2]. The multipliers can be combined with fp (5-valued addition) into single 5-valued reversible functions. So, in fact the advantage of the method is that one can create codewords with more symbols than the value of the applied logic that can correct multiple errors. For some applications that can be a significant advantage, as it may prevent going into large value logic approaches.

One disadvantage of the RS-code in Galois configuration is that RS codewords are created individually: they can not be created by letting the coder run and pick out a new codeword. In fact in an RS-coder in Galois configuration one has to start with a shift register with content of all 0s. As disclosed by the earlier cited patent application if one has very cheap or fast means for analyzing a very long sequence, one can use a codeword as generated according to cited patent application Ser. No. 11/739,189 and test if the received codeword has a certain number of symbols in common with a tested portion of the sequence. If such comparison generates a minimum number then one has detected and corrected the codeword.

There is known literature available that describes the generation of RS-code. One book is: Error Control Coding by Shu Lin and Daniel Costello, second edition, Prentice Hall, 2004. The conditions for an (p,k) RS-codeword over GF(q) to be able to correct t errors are:

$p = q-1;$ overhead $p-k = 2*t;$ $k = q-1-2t;$ minimum distance $d = 2*t+1;$

In many cases the variable q is created from m bits so that $GF(q)=GF(2^m)$. In that case the Galois Field is called an extended binary Galois Field. The extended field allows creating for instance an GF(8) wherein each 8-valued symbol can be expressed as a binary word of 3 bits.

RS (p,k) codewords, meeting earlier cited conditions can be created by a method using an LFSR in Galois configuration. In that case the LFSR has (p−k) elements, with initial content of the shift register being all 0s. The k information symbols are shifted into the LFSR for k clock pulses, thus filling the (p−k) shift register elements with a new content. The RS codeword is the combination of k information symbols with (p−k) symbols of the final state of the shift register. Because in practical applications k>>(p−k) one tends to prefer the Galois configuration.

Less known, but equally workable is the Fibonacci LFSR configuration for the RS coder. In that case the coder has an LFSR of k elements. The initial value of the shift register is formed by the k data symbols. By running the LFSR for p clock cycles the complete information word is entered and the remaining (p−k) symbols for the RS codeword are generated.

The Fibonacci configuration has a further advantage. The LFSR in an RS coder should run for p clock cycles to produce the (p−k) check symbols providing k information symbols into the LFSR. Usually this is done by shifting the information symbols into the shift register. This is followed by shifting out the check symbols out of the register of a Galois LFSR. Combined the coding (and decoding process) with a Fibonacci LFSR may take p+(p−k)=2p−k clock cycles. It should be noted that all LFSRs work under a clock signal. Such a clock signal is assumed in all the drawings and descriptions though not always shown or identified.

FIG. 2 shows a Fibonacci LFSR. One can see that producing (p−k) check symbols requires running the LFSR for (p−k) cycles after the register was completely filled. The check symbols will be available immediately at an output and do not require to be shifted out. In a Fibonacci LFSR the coding process may take just p clock cycles including shifting in the symbols into the LFSR. It should be clear that this number is only correct if all function operations are completed with a clock cycle.

Figure 2A:
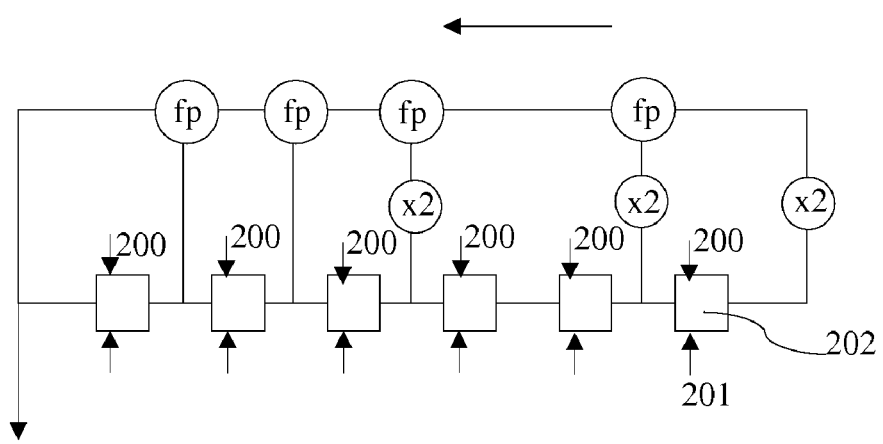
FIG. 2a is another diagram of an LFSR in Fibonacci configuration enabled for direct initialization.

FIG. 2a shows how the shift register elements can also be filled in one instance. For instance at an enabling signal provided to all individual elements of the shift register, each element is provided with its individual initial state. For instance when an enabling signal is provided on a common input 200 the shift register element 202 assumes the symbol that is provided on input 201 as is shown in FIG. 2a. The time for creating a codeword can thus be reduced to (p−k) clock cycles, provided that all function operations of the LFSR can be completed within a single cycle.

The difference between the Galois and Fibonacci LFSR configuration is that in practical terms the Galois LFSR is smaller (if k>>(n−k)) but may have to run for more clock pulses. The Fibonacci LFSR (for k>>(n−k)) is larger, but may have to run for a fewer number of clock pulses if the number of feedback taps is small. This is illustrated in FIG. 3 and FIG. 4 for a (7,3) RS code which is a Reed Solomon code of which a codeword is 7 symbols and of which 3 symbols are information symbols.

How to create equivalent Galois and Fibonacci LFSR configurations has been demonstrated by the inventor in an invention described in U.S. Non-Provisional patent application Ser. No. 11/696,261 entitled: BINARY AND N-VALUED LFSR AND LFCSR BASED SCRAMBLERS, DESCRAMBLERS, SEQUENCE GENERATORS AND DETECTORS IN GALOIS CONFIGURATION filed on Apr. 4, 2007 and which is incorporated herein by reference in its entirety.

Figure 3:
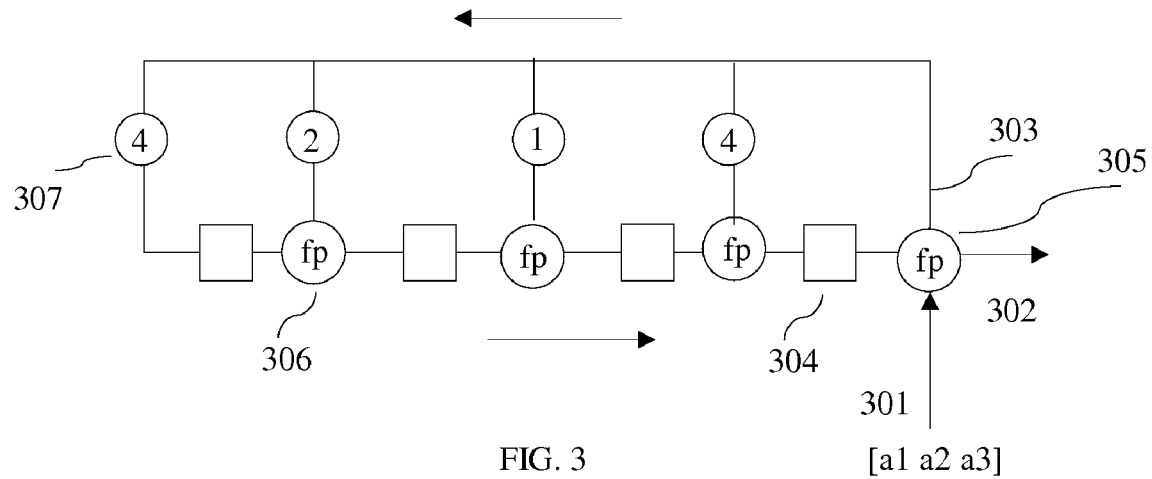
FIG. 3 is a diagram of an LFSR in Galois configuration.
Figure 4:
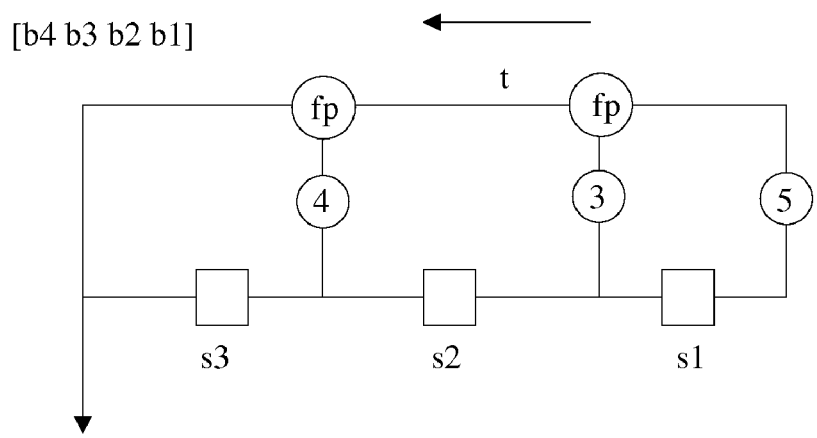
FIG. 4 is a diagram of another LFSR in Fibonacci configuration.

FIG. 3 shows a structure that resembles an RS-coder in Galois configuration. One skilled in the art will recognize that this is not really an RS-coder as it does not comprise the switches required to allow entering the data symbols on 301 and then switching to a situation where the content of the shift register elements are outputted on 302. However it shows that symbols are provided on 301 and 302. What will happen during coding is that initially the shift register content is all 0s. Then during k clock cycles the k data symbols will be inputted on 301. Immediately after the first clock cycle there can be a non-zero element in the last element 304 of the shift register, creating feedback symbols on 303 through n-valued adder fp 305. After k clock cycles no more data symbols will be entered. Because in this configuration the n-valued adder fp is used, one may also say that after k clock cycles only 0 symbols are entered. This means that after k clock cycles the content of the shift register is only shifted and will not change. One may say that in clock cycles after k clock cycles the remainder is shifted out of the shift register.

The (7,3) configuration in FIG. 3 shows the classical multiplier and adder functions fp. The adder fp is an 8-valued adder over $GF(2^3)$ as provided in an article by Bernard Sklar, entitled Reed-Solomon Codes and available on-line at http://www.informit.com/content/images/art_sklar7_reed-solomon/elementLinks/art$_{sklar}$7_reed-solomon.pdf. The multipliers are also defined over $GF(2^3)$. The truth table of fp and the multiplier are provided in the following truth tables. A multiplier as shown in FIG. 3 at 307 (multiplier 4) is defined as the row (using origin 0) in the multiplier truth table 'mul' e.i.: [0 4 5 6 7 1 2 3].

| c<br>fp | 0 | 1 | 2 | b<br>3 | 4 | 5 | 6 | 7 |
|---|---|---|---|---|---|---|---|---|
| 0 | 0 | 1 | 2 | 3 | 4 | 5 | 6 | 7 |
| 1 | 1 | 0 | 4 | 7 | 2 | 6 | 5 | 3 |
| a 2 | 2 | 4 | 0 | 5 | 1 | 3 | 7 | 6 |
| 3 | 3 | 7 | 5 | 0 | 6 | 2 | 4 | 1 |
| 4 | 4 | 2 | 1 | 6 | 0 | 7 | 3 | 5 |
| 5 | 5 | 6 | 3 | 2 | 7 | 0 | 1 | 4 |
| 6 | 6 | 5 | 7 | 4 | 3 | 1 | 0 | 2 |
| 7 | 7 | 3 | 6 | 1 | 5 | 4 | 2 | 0 |

| c<br>mul | 0 | 1 | 2 | b<br>3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| a 2 | 0 | 2 | 3 | 4 | 5 | 6 | 7 | 1 |
| 3 | 0 | 3 | 4 | 5 | 6 | 7 | 1 | 2 |
| 4 | 0 | 4 | 5 | 6 | 7 | 1 | 2 | 3 |
| 5 | 0 | 5 | 6 | 7 | 1 | 2 | 3 | 4 |
| 6 | 0 | 6 | 7 | 1 | 2 | 3 | 4 | 5 |
| 7 | 0 | 7 | 1 | 2 | 3 | 4 | 5 | 6 |

The same 8-valued adding function fp and multiplier 'mul' are used in the (7,3) RS-coder in the Fibonacci configuration in FIG. 4 which is identical to the code generator of FIG. 3.

Figure 5:
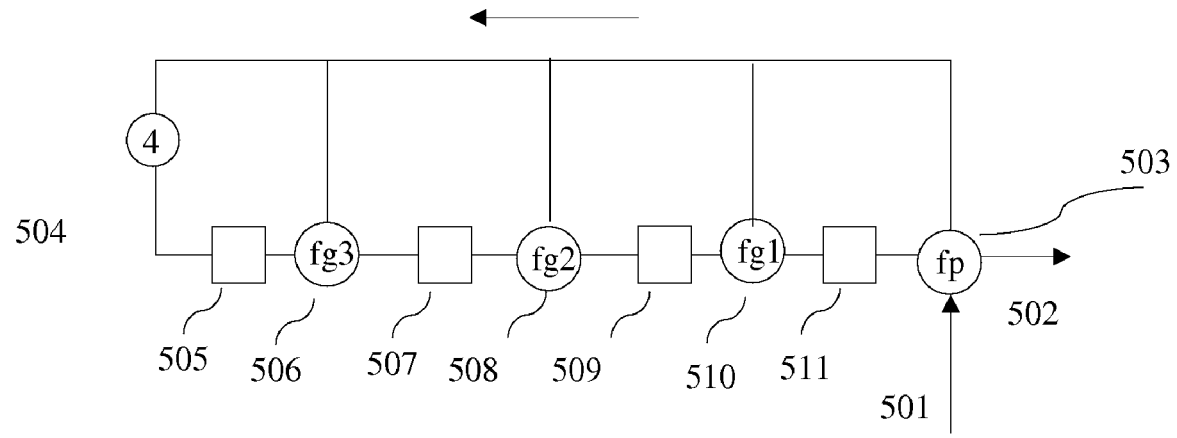
FIG. 5 is a diagram of an LFSR demonstrating a Reed Solomon coder.
Figure 6:
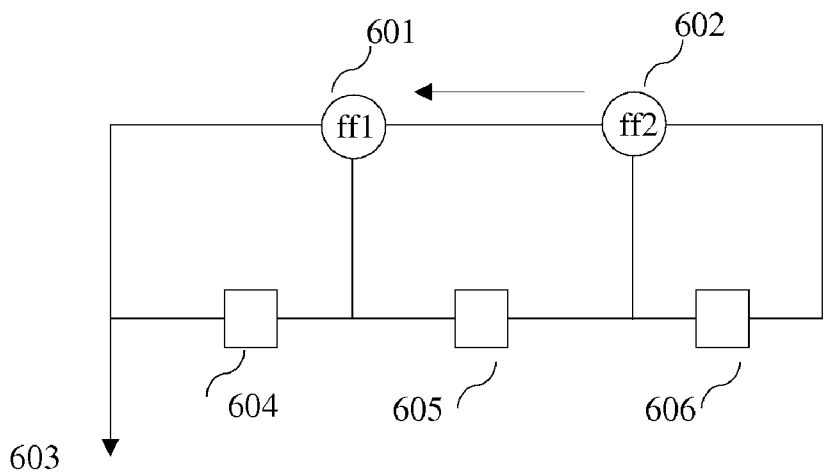
FIG. 6 is another diagram of an LFSR in Fibonacci configuration.

As was shown by the inventor in an earlier invention as described in U.S. Non-Provisional patent application Ser. No. 10/935,960, filed Sep. 8, 2004 entitled: TERNARY AND MULTI-VALUE DIGITAL SIGNAL SCRAMBLERS, DESCRAMBLERS AND SEQUENCE GENERATORS, and which is incorporated herein by reference in its entirety, it is possible to combine an n-valued logic function with n-valued multipliers or inverters into a single n-valued logic function. When the function and multipliers or inverters are reversible then the combined function is also reversible. Accordingly the Galois configuration as shown in FIG. 3 can be replaced by the Galois configuration as shown in FIG. 5 and the Fibonacci configuration as shown in FIG. 4 can be replaced by a Fibonacci configuration as shown in FIG. 6.

Error Correction by Symbol Reconstruction

The following will describe error correction by symbol reconstruction. The principle thereof is straight forward. One may assume that in this illustrative case 2 symbols in a codeword in a certain position are in error. For simplicity it is assumed that 2 adjacent symbols are in error. However errors may occur in any order of course. If these particular symbols are in error in the illustrative example, then clearly one also may assume that the other symbols are not in error. Accordingly one can calculate the supposedly "in error" symbols from the supposedly "error-free" symbols. A reconstructed codeword then has at most 2 symbols in difference with the original codeword. Based on the characteristics of the coding method one can not construct more than one valid codeword that has only 2 or less symbols in difference with the original codeword with errors. If it turns out that the original codeword had no errors then all symbols of the reconstructed and the original codeword are in common.

"Symbols in common" between a calculated codeword and an RS codeword is intended to mean symbols in common in like or corresponding positions. For instance the codewords [0 1 2 3 4 5] and [5 4 3 2 1 0] have 6 symbols in common, but have no symbols in corresponding positions in common.

It is of course possible in the assumption that not the selected 2 symbols but 2 different code symbols were in error. Based on the assumption and according to the characteristics of the code one will then have created a codeword on that assumption that has a difference of more than 2 symbols with the original codeword and thus should be rejected as an incorrect solution.

Accordingly one has to either create all possible errors, or only those errors that matter. For instance in a (7,3) code there are 3 information symbols that determine the 4 remainder symbols. Assuming that the errors occur in the remainder and not in the information symbol one can just take the three information symbols and recalculate the remainder. The newly recalculated codeword can then at maximum only have a two symbol difference with the original codeword. If that is the case then the calculated codeword is the error-free codeword.

Because the functions as used in FIG. 5 and FIG. 6 can be reversed one can then apply the method of error correction by reconstructing of symbols. In a (7,3) RS-code there are 3 information symbols and 4 overhead symbols. The properties of the RS-code are such that each 7 symbol word in that code only has 2 symbols in common in like or corresponding positions with each other codeword.

In order to perform error correction a set of equations has to be solved. As shown in the earlier cited patent application Ser. No. 11/739,189 it is assumed for ease of formula manipulation that potential errors that occur are adjacent to each other. That condition is not required for the method here provided as one aspect of the present invention to work, however it will limit the number of formulas and makes the process easier to follow for illustrative purposes. The assumption then is that 2 errors will have occurred in two adjacent symbols of the 7 symbol codeword and that 5 symbols are correct. Based on the assumed to be correct symbols one can calculate the assumed to be in error symbols. Accordingly one has then calculated an assumed to be correct 7 symbol codeword. One then determines how many symbols in the calculated word and in the "in error" codeword in like positions are in common. If calculated and received overhead symbols (or remainder symbols) are identical, then no errors have occurred. If at least 5 symbols in the original (7,3) codeword and the calculated (7,3) codeword are in common in like positions, then the calculated codeword is the correct codeword and the 3 information symbols in the calculated codeword are the error free information symbols.

Figure 7:
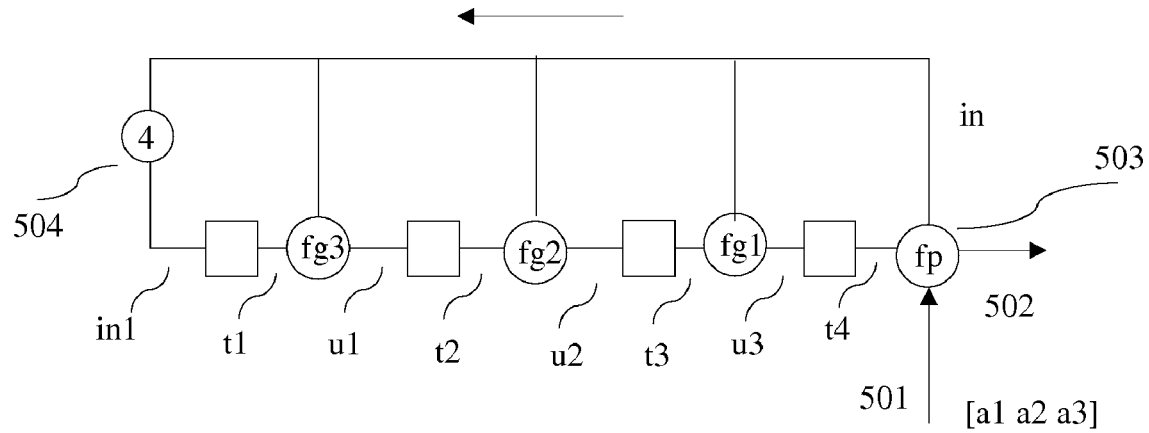
FIG. 7 is a diagram illustrating a Reed Solomon coder.
Figure 8:
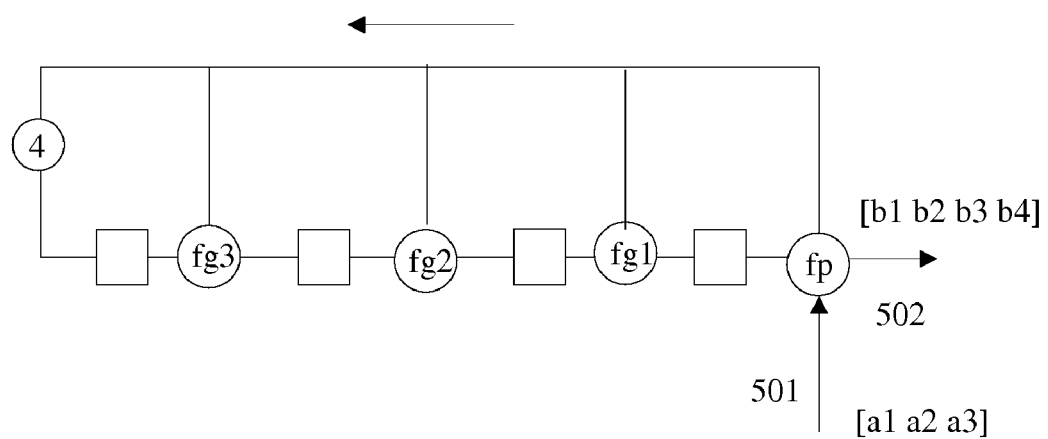
FIG. 8 is another diagram illustrating a Reed Solomon coder.

First it is shown how the equation set is determined for the Galois configuration. FIG. 7 shows how the intermediate results are determined in the LFSR. When the circuit starts the content of the shift register is all 0s. The circuit will run and shift for three clock pulses. The input is [a1 a2 a3]. At the end of the 3 pulses the overhead symbols (from back to front of the shift register) should be [b1 b2 b3 b4]. The total codeword then is [a1 a2 a3 b1 b2 b3 b4]. FIG. 8 shows how [b1 b2 b3 b4] are the generated result.

The following equations are determined after entering a symbol at 501. First symbol a1 entered:

$$t1=0$$

$$t2=0$$

$$t3=0$$

$$t4=0,$$

wherein t1, t2, t3 and t4 are the outputs of the shift register elements.

$$in=a1$$

$$in1=4*in=4*a1$$

$$u1=2*in+0=2*a1$$

$$u2=in+0=a1$$

$$u3=4*in+0=4*a1$$

After clock pulse:

$$t1=in1=4a1$$

$$t2=2a1$$

$$t3=a1$$

$$t4=4a1$$

Second symbol a2 entered:

$$in=t4+a2=4a1+a2$$

$$in1=4*in=4*4a1+4*a2$$

$$u1=2*in+t1=2(4a1+a2)+4a1$$

$$u2=in+t2=(4a1+a2)+2a1$$

$$u3=4*in+t3=4*(4a1+a2)+a1$$

After the clock pulse:

$$t1=in1=4*(4a1+a2)$$

$$t2=u1=(2*(4a1+a2)+4a1)$$

$$t3=u2=(4a1+a2)+2a1$$

$$t4=u3=(4*(4a1+a2)+a1)$$

Third symbol a3 entered:

$$in=t4+a3=(4*(4a1+a2)+a1)+a3$$

$$in1=4*in=4*((4*(4a1+a2)+a1)+a3)$$

$$u1=2*in+t1=2*((4*(4a1+a2)+a1)+a3)+4*(4a1+a2)$$

$$u2=in+t2=(4*(4a1+a2)+a1)+a3+(2*(4a1+a2)+4a1)$$

$$u3=4*in+t3=4*((4*(4a1+a2)+a1)+a3)+(4a1+a2)+2a1$$

The result [in1 u1 u2 u3] is the remainder achieved by the Galois configuration. It should be noted that the '+' function is provided by fp and the * or multiplication by 'mul'. Due to the fact that addition with 0 does not affect the result and multiplication by 0 is 0 one can actually apply Galois arithmetic to these equations. One can also combine addition with the multipliers and create single functions that are reversible.

The same approach can be used for creating the equation set for the Fibonacci configuration. In the Fibonacci configuration as shown in FIG. 4 the shift register will contain the 3 data symbols as [s3 s2 s1]. The configuration has to run for 4 cycles to generate the 4 overhead symbols. This can be described by the following equation set. Before first pulse:

$$s1=a3$$

$$s2=a2$$

$$s3=a1$$

$$t=5*s3+3*s2=5a1+3a2$$

$$b1=t+4*s1=5a1+3a2+4a3$$

After a clock pulse:

$$s1=b1$$

$$s2=a3$$

$$s3=a2$$

$$t=5*s3+3*s2=5a2+3a3$$

$$b2=t+4*s1=5a2+3a3+4b1$$

After next clock pulse $s1=b2$ $s2=b1$ $s3=a3$ $t=5a3+3b1$ $b3=5a3+3b1+4b2$

After next clock pulse $s1=b3$ $s2=b2$ $s3=b1$ $t=5b1+3b2$ $b4=5b1+3b2+4b3$

It should be clear that once one knows what the information symbols [a3 a2 a1] are, one can calculate the overhead symbols [b4 b3 b2 b1] from the expressions, without actually running an LFSR. If one so desires one can actually store the relevant codewords in a memory and use the information symbols for example as a memory address. This applies to actually all LFSR generated symbols or words and not only to the (7,3) code which is used as an illustrative example. It is assumed that sometimes LFSR generated symbols or words are pseudo-random which some may interpret as the words being undetermined until generated. However it should be clear that LFSR generated symbols are deterministic.

Galois Field Arithmetic

In the earlier cited provisional patent application Ser. No. 11/739,189 it was shown that reversing functions can be used to reconstruct the symbols. This will be repeated here again as one embodiment for RS-code reconstruction. However as another embodiment one may also apply Galois Field Arithmetic. To those skilled in the art it should be clear that operations such as replacing subtraction by addition and division by multiplication etc depend on the Galois Field and have to be determined accordingly. However the principles are the same for extended Galois Fields and can be extended to any GF(q) or $GF(2^m)$. Some operations, such as an addition being self reversing only applies in extended GFs.

One approach is to solve the equations for the Galois configuration. Another approach is to solve the equations for the Fibonacci configuration. The results are identical. One can easily check this by running both coders and comparing the results.

The following will provide rules for arithmetic in $GF(2^3)$ using the definition of 'fp' for addition and 'mul' for multiplication as shown in the respective truth tables. There are several rules that can be derived from the truth tables.

First rule: For every x (wherein x is a variable that can have one of 8 states) 'x fp x=0'. Or fp(x,x)=0. Or, to use the terms of +, * and ÷:x+x=0 in this $GF(2^3)$.

Second rule: The reverse of fp is the function itself. Or the function fp is self-reversing. Or again in the terms of arithmetic of this $GF(2^3)$: c=a+b→a=c−b or a=c+b=b+c.

Third rule: Dividing by a factor α is identical to multiplying by a factor β. In fact multiplying a variable x by a constant α in the $GF(2^3)$ is identical to inverting the variable x=[0 1 2 3 4 5 6 7] by the inverter representing the factor α. Assume that α=5. In the multiplier this means the row representing α=5 in multiplier truth table 'mul'; or the inverter [0 5 6 7 1 2 3 4]. Dividing by 5 in the $GF(2^3)$ is multiplying by $β=5^{-1}$. In that case $α*β=5*5^{-1}=1$. Or in terms of inversion one may conclude that the inverter represent $P=5^{-1}$ in the $GF(2^3)$ should reverse the inverter representing α=5. One can easily check that the reversing inverter is then β=4 or [0 4 5 6 7 1 2 3]. The following table shows the division table 'div' as the inverse to 'mul' in the $GF(2^3)$.

|   |     |   |   |   | b |   |   |   |   |
|---|-----|---|---|---|---|---|---|---|---|
|   | div | 0 | 1 | 2 | 3 | 4 | 5 | 6 | 7 |
|   | 0   | 0 | 0 | 0 | 0 | 0 | 0 | 0 | 0 |
|   | 1   | 0 | 1 | 2 | 3 | 4 | 5 | 6 | 7 |
| a | 2   | 0 | 7 | 1 | 2 | 3 | 4 | 5 | 6 |
|   | 3   | 0 | 6 | 7 | 1 | 2 | 3 | 4 | 5 |
|   | 4   | 0 | 5 | 6 | 7 | 1 | 2 | 3 | 4 |
|   | 5   | 0 | 4 | 5 | 6 | 7 | 1 | 2 | 3 |
|   | 6   | 0 | 3 | 4 | 5 | 6 | 7 | 1 | 2 |
|   | 7   | 0 | 2 | 3 | 4 | 5 | 6 | 7 | 1 |

Or: $1^{-1}=1$; $2^{-1}=7$; $3^{-1}=6$; $4^{-1}=5$; $5^{-1}=4$; $6^{-1}=3$; $7^{-1}=2$

Fourth rule: The fp and mul functions are distributive: or $a*(b+c)=a*b+a*c$

Fifth rule: The function fp is associative: or $a+(b+c)=(a+b)+c$

Sixth rule: the functions fp and mul are commutative: or $a+b=b+a$ and $a*b=b*a$.

In the above + is set equivalent with fp and * with mul.

For convenience the following relations are provided in the $GF(2^3)$. One can check these relations by applying the truth tables:

| | | | | | |
|---|---|---|---|---|---|
| x + x = 0 | | | | | |
| x + 2x = 4x | | | | | |
| x + 3x = 7x | 2x + 3x = 5x | | | | |
| x + 4x = 2x | 2x + 4x = x | 3x + 4x = 6x | | | |
| x + 5x = 6x | 2x + 5x = 3x | 3x + 5x = 2x | 4x + 5x = 7x | | |
| x + 6x = 5x | 2x + 6x = 7x | 3x + 6x = 4x | 4x + 6x = 3x | 5x + 6x = x | |
| x + 7x = 3x | 2x + 7x = 6x | 3x + 7x = x | 4x + 7x = 5x | 5x + 7x = 4x | 6x + 7x = 2x |

One can make a similar table for multiplications.

| | | | | | |
|---|---|---|---|---|---|
| 2 * 2 = 3 | | | | | |
| 2 * 3 = 4 | 3 * 3 = 5 | | | | |
| 2 * 4 = 5 | 3 * 4 = 6 | 4 * 4 = 7 | | | |
| 2 * 5 = 6 | 3 * 5 = 7 | 4 * 5 = 1 | 5 * 5 = 2 | | |
| 2 * 6 = 7 | 3 * 6 = 1 | 4 * 6 = 2 | 5 * 6 = 3 | 6 * 6 = 4 | |
| 2 * 7 = 1 | 3 * 7 = 2 | 4 * 7 = 3 | 5 * 7 = 4 | 6 * 7 = 5 | 7 * 7 = 6 |

It is an advantage of addition functions over $GF(q=2^m)$ with m≥2 that x+x=0 for any of the GF(q) fields. That makes arithmetic over GF($q=2^m$) relatively easy, as addition is then a self-reversing function that is associative.

An example according to one aspect of the present invention of reconstructing the symbols in an (7,3) RS-code with errors using error assumptions and applying the GF arithmetic rules on the Fibonacci equation set will be provided next.

The simplest error-occurrence is when the two errors appear in [b4 b3 b2 b1] and [a3 a2 a1] has no errors. The error situations then can be:
[b4 b3 e2 e1 a3 a2 a1]
[b4 e2 e1 b1 a3 a2 a1]
[e2 e1 b2 b1 a3 a2 a1]
One can address this situation by calculating [b4 b3 b2 b1] from the equations. Comparing the calculated word can provide the following situations:
1. 5 or more symbols between the calculated and original word are identical in identical positions. In that case the calculated word is the correct word and [a3 a2 a1] are the correct information symbols
2. less than 5 symbols are identical. In that case there are more than 2 errors (this violates the assumption of at most 2 errors) or the errors occurred in at least one different place than assumed.

It is next assumed that the errors occur in b1 and a3 or the codeword is [b4 b3 b2 e1 e2 a2 a1]. Earlier the equation was determined for calculating b4 in Fibonacci configuration (not having errors) by b4=5b1+3b2+4b3. In this case b1 is in error. One can then calculate b1 from:

$$5b1 = b4 + 3b2 + 4b3 \text{ to}$$
$$b1 = 5^{-1}*b4 + 5^{-1}*3*b2 + 5^{-1}*4*b3$$
$$= 4*b4 + 4*3*b2 + 4*4*b3$$
$$= 4b4 + 6b2 + 7b3$$

One can exhaustively test the above expression. One example would be to use the 8-valued word [a1 a2 a3]=[0 6 7]. One may use either the Galois configuration of FIG. 3 with initial shift register or the Fibonacci configuration of FIG. 4 with initial shift register [a3 a2 a1]=[7 6 0] to create the RS(7,3) codeword [a1 a2 a3 b1 b2 b3 b4]=[0 6 7 7 2 6 2]. Substituting the values of [b2 b3 b4] in the equation b1=4b4+6b2+7b3 will generate the calculated value b1=7.

The next step (as a3 was assumed also to be in error) is to calculate a3 from symbols in the RS(7,3) codeword which are assumed to be correct. For example one can use: b3=5a3+3b1+4b2 to solve a3. However one can only execute this expression after b1 was calculated. If it is required to calculate b1 and a3 in parallel one may use the earlier equation for calculation of b1. For the illustrative example it may be assumed that b1 is first calculated. This can then be followed by: 5*a3=b3+4*b2+3*b1 (working under + is fp and * is mul) and a3=$5^{-1}$*b3+$5^{-1}$*4*b2+$5^{-1}$*3*b1=4*b3+4*4*b2+4*3*b1=4b3+7b2+6b1. Using Galois arithmetic this will generate a3=7.

After calculating b1 and a3 one then should compare the calculated codeword with the original codeword with errors. If in comparing the calculated and original codewords have at least 5 symbols in like positions in common, the calculated codeword is the correct codeword and [a1 a2 a3] wherein a3 was reconstructed is then the correct set of information symbols.

One may repeat this approach when a3 and a2 or a2 and a1 are in error. However when one may assume that [b1 b2 b3 b4] was error free one can directly calculate [a3 a2 a1] using the reversed equations as shown before.

It is also possible to use the methods according to one aspect of the present invention to correct non-adjacent errors. The correction of adjacent errors has been shown as an illustrative example of RS error correction according to one aspect of the present invention. Because errors are adjacent one can use equations wherein just one of the assumed errors will participate. Solving the problem is then just solving an equation with one variable. To show a wider applicability of aspects of the present invention assume two errors that are separated by an error-free symbol, for instance assume the original codeword [b4 b3 e2 b1 e1 a2 a1] wherein b2 and a3 are assumed to be in error.

Use the following two earlier equations from the Fibonacci (7,3) coder to solve this problem:

$$b3=5a3+3b1+4b2 \text{ and}$$

$$b2=5a2+3a3+4b1.$$

One can rewrite the equations as:

$$0+5a3+3b1+4b2+b3=0 \quad \text{(rs-1) and}$$

$$5a2+3a3+4b1+b2+0=0. \quad \text{(rs-2)}$$

The problem of solving a3 and b2 can be done in the normal way, adjusted for the rules for + and * in the present Galois Field.

How to use the equations in matrix form in limited form for the illustrative example is shown in the following tables. First one solves the equations for b2 by eliminating a3. One can do that by multiplying equation (rs-1) by 3 and (rs-2) by 5. One can achieve the same by multiplying (rs-2) with a factor β so that β*3=5. This can be achieved with β=3. This is shown in the following table:

| a2 | a3 | b1 | b2 | B3 | * |
|----|----|----|----|----|----|
| 0 | 5 | 3 | 4 | 1 | 1 |
| 5 | 3 | 4 | 1 | 0 | 3 |
|    |    |    |    |    | + |
| 0 | 5 | 3 | 4 | 1 |   |
| 7 | 5 | 6 | 3 | 0 |   |
| 7 | 0 | 4 | 6 | 1 | + |

In order to calculate b2 one has to divide by 6:

| a2 | a3 | b1 | b2 | b3 | * |
|----|----|----|----|----|----|
| 0 | 5 | 3 | 4 | 1 |   |
| 7 | 5 | 6 | 3 | 0 |   |
| 7 | 0 | 4 | 6 | 1 | + |
| 2 | 0 | 6 | 1 | 3 | /6 = *3 |

Accordingly b2=2a2+6b1+3b3=2*6+6*7+36=7+5+1=2.

One has to execute a similar process to eliminate b2:

| a2 | a3 | b1 | b2 | b3 | * |
|----|----|----|----|----|----|
| 0 | 5 | 3 | 4 | 1 | 1 |
| 5 | 3 | 4 | 1 | 0 | 4 |
|    |    |    |    |    | + |

-continued

| a2 | a3 | b1 | b2 | b3 | * |
|----|----|----|----|----|---|
| 0  | 5  | 3  | 4  | 1  |   |
| 1  | 6  | 7  | 4  | 0  |   |
| 1  | 1  | 1  | 0  | 1  | + |

Accordingly a3=a2+b1+b3=6+7+6=7.

It should be clear to those skilled in the art that one can use a matrix representing the equations for generating the (p,k) code for instance in Fibonacci form to solve equations for different error situations. Such a matrix method, as shown in the illustrative example also does not require for the errors to be adjacent.

Reversing Functions Methods

Galois Field methods as presented here in error correction methods as one aspect of the present invention rely upon certain aspects of Galois Field arithmetic and allow to be manipulated in matrix format. However this is a convenience factor that is not really required. The reason for that is that as demonstrated in earlier inventions by the inventor such as in earlier cited patent application Ser. No. 10/935,960 that a reversible n-valued two input/single output logic function with reversible n-valued inverters at inputs and/or at the output can be combined into single n-valued reversible logic functions with no inverters. Accordingly the RS codeword generators as shown in FIG. 3 and FIG. 4 are equivalent to the Galois and Fibonacci codeword generators as shown in FIG. 5 and FIG. 6. In FIG. 5 the Galois configuration of replaces multipliers and adders fp of FIG. 3 by Galois configuration reversible 8-valued functions fg1, fg2 and fg3. The function fp at the input of the coder remains and so does the multiplier m=4. In FIG. 6 the two functions fp and the three multipliers of FIG. 4 have been replaced by the two reversible 8-valued functions ff1 and ff2. For illustrative purposes creating the reversible equations will be limited to the Fibonacci configuration of FIG. 6. It should be clear that the reversing can also be applied to the Galois configuration of FIG. 5.

The following equations apply to the Fibonacci configuration of FIG. 6 to generate the codeword [b4 b3 b2 b1 a3 a2 a1] when starting with content [a3 a2 a1] in the shift register.

t=a2 ff2 a1
b1=a3 ff1 t
Next cycle:
t=a3 ff2 a2
b2=b1 ff1 t
Next cycle:
t=b1 ff2 a3
b3=b2 ff1 t
Next cycle:
t=b2 ff2 b1
b4=b3 ff1 t The variable t provides an intermediary value for the next step in determining a new output value.

For example assume that an RS(7,3) codeword [b4 b3 b2 b1 a3 a2 a1] has two adjacent errors so that symbols b1 and a3 are in error. The last equations can be applied to solve b1 and assuming that symbols b4, b3 and b2 are correct. The following rules apply: ff1 and ff2 are reversible, possibly they are not commutative. Further more in an equation a ff b, the function ff can be represented by a truth table wherein 'a' indicates a row in the truth table and 'b' represents a column. Accordingly if 'c=a ff b' then 'b=a ffrc c' and 'a=c ffr b'. Herein 'ffrc' represents the reversing truth table of 'ff' over the columns and 'ffrr' represents the reversing truth table of 'ff' over the rows.

With that 'b4=b3 ff1 t' provides 't=b3 ff1rc b4'. And 't=b2 ff2 b1' provides 'b1=b2 ff2rc t'. Calculating t from 't=b3 ff1rc b4' and substituting into 'b1=b2 ff2rc t' will provide the value of b1 under the present assumptions. One can in a similar fashion determine the value of a3 and generate a calculated codeword. One should then compare the calculated codeword with the original codeword. If the calculated and the original (7,3) codewords have at least 5 symbols in like positions in common then the calculated codeword is the correct codeword and the calculated a3 together with the original a2 and a1 are the correct information symbols.

One can repeat the methods here provided with single reversible n-valued logic functions for any of the assumptions of symbols in [b4 b3 b2 b1 a3 a2 a1] being in error within the constraints of a (7,3) Reed-Solomon code. While the initial effort appears to be different from using Galois arithmetic, it should be clear that both methods will lead to identical results. The difference may be that the Galois expressions may be simplified and may be comprised of fewer expressions. However in achieving the correct reconstruction there is no difference.

7-Valued Examples

For illustrative purposes the two methods: error correction in RS(p,k) by reconstructing symbols by Galois arithmetic and by reversing functions will be applied to a 7-valued RS(6,2) code. The 7-valued RS(6,2) codeword has 6 7-valued symbols of which 2 are 7-valued information symbols. With this code one can correct up to two errors.

The following truth table shows the 7-valued function fp representing an addition in GF(7).

| fp | 0 | 1 | 2 | 3 | 4 | 5 | 6 |
|----|---|---|---|---|---|---|---|
| 0  | 0 | 1 | 2 | 3 | 4 | 5 | 6 |
| 1  | 1 | 2 | 3 | 4 | 5 | 6 | 0 |
| 2  | 2 | 3 | 4 | 5 | 6 | 0 | 1 |
| 3  | 3 | 4 | 5 | 6 | 0 | 1 | 2 |
| 4  | 4 | 5 | 6 | 0 | 1 | 2 | 3 |
| 5  | 5 | 6 | 0 | 1 | 2 | 3 | 4 |
| 6  | 6 | 0 | 1 | 2 | 3 | 4 | 5 |

This function is created from the modulo-7 addition.

The following truth table shows the 7-valued function 'mul' representing a 7-valued multiplication in GF(7).

| mul | 0 | 1 | 2 | 3 | 4 | 5 | 6 |
|-----|---|---|---|---|---|---|---|
| 0   | 0 | 0 | 0 | 0 | 0 | 0 | 0 |
| 1   | 0 | 1 | 2 | 3 | 4 | 5 | 6 |
| 2   | 0 | 2 | 4 | 6 | 1 | 3 | 5 |
| 3   | 0 | 3 | 6 | 2 | 5 | 1 | 4 |
| 4   | 0 | 4 | 1 | 5 | 2 | 6 | 3 |
| 5   | 0 | 5 | 3 | 1 | 6 | 4 | 2 |
| 6   | 0 | 6 | 5 | 4 | 3 | 2 | 1 |

The function 'mul' is created from the modulo-7 multiplication. The functions are distributive and associative.

The following truth table shows the 7-valued function 'div' representing a 7-valued division.

| div | 0 | 1 | 2 | 3 | 4 | 5 | 6 |
|-----|---|---|---|---|---|---|---|
| 0   | 0 | 0 | 0 | 0 | 0 | 0 | 0 |
| 1   | 0 | 1 | 2 | 3 | 4 | 5 | 6 |

| div | 0 | 1 | 2 | 3 | 4 | 5 | 6 |
|---|---|---|---|---|---|---|---|
| 2 | 0 | 4 | 1 | 5 | 2 | 6 | 3 |
| 3 | 0 | 5 | 3 | 1 | 6 | 4 | 2 |
| 4 | 0 | 2 | 4 | 6 | 1 | 3 | 5 |
| 5 | 0 | 3 | 6 | 2 | 5 | 1 | 4 |
| 6 | 0 | 6 | 5 | 4 | 3 | 2 | 1 |

From the functions 'mul' and 'div' one can see that dividing by a number is identical to multiplying by a number. For instance $x/3=5*x$. or $3^{-1}x=5*x$. Further more multiplication and addition are commutative in GF(7). For illustrative purposes the following tables of addition and multiplication in GF(7) are provided.

$x + x = 2x$
$x + 2x = 3x$
$x + 3x = 4x$   $2x + 3x = 5x$
$x + 4x = 5x$   $2x + 4x = 6x$   $3x + 4x = 0$
$x + 5x = 6x$   $2x + 5x = 0$    $3x + 5x = x$    $4x + 5x = 2x$
$x + 6x = 0$    $2x + 6x = x$    $3x + 6x = 2x$   $4x + 6x = 3x$   $5x + 6x = 4x$

One can make a similar table for multiplications in GF(7).

$2 * 2 = 4$
$2 * 3 = 6$   $3 * 3 = 2$
$2 * 4 = 1$   $3 * 4 = 5$   $4 * 4 = 2$
$2 * 5 = 3$   $3 * 5 = 1$   $4 * 5 = 6$   $5 * 5 = 4$
$2 * 6 = 5$   $3 * 6 = 4$   $4 * 6 = 3$   $5 * 6 = 2$   $6 * 6 = 1$

The following truth tables show the reversing functions for fp. It is clear that fp is not self reversing as in the 8-valued example. Accordingly the 7-valued function has two reversing functions: one over the rows and one over the columns of the truth table of fp. The expression c=a+b can be considered as a function with two inputs: 'a' and 'b'. The variable 'a' represents the row of the truth table and 'b' the columns. One can then write c=fp(a,b). Because fp is commutative this would generate the same result as fp(b,a). However in dealing with the reversing function it is important to keep track of the order of 'a' and 'b'. First the reversing function 'minr' will be determined over row 'a'. In formula: when c=f(a,b) then a=minr(c,b). This generates the following truth table:

| minr | 0 | 1 | 2 | 3 | 4 | 5 | 6 |
|---|---|---|---|---|---|---|---|
| 0 | 0 | 6 | 5 | 4 | 3 | 2 | 1 |
| 1 | 1 | 0 | 6 | 5 | 4 | 3 | 2 |
| 2 | 2 | 1 | 0 | 6 | 5 | 4 | 3 |
| 3 | 3 | 2 | 1 | 0 | 6 | 5 | 4 |
| 4 | 4 | 3 | 2 | 1 | 0 | 6 | 5 |
| 5 | 5 | 4 | 3 | 2 | 1 | 0 | 6 |
| 6 | 6 | 5 | 4 | 3 | 2 | 1 | 0 |

The reversing function 'minc' of fp over the columns is determined by: when c fp)(a,b) then b=minc(a,c) with the truth table of 'minc':

| minc | 0 | 1 | 2 | 3 | 4 | 5 | 6 |
|---|---|---|---|---|---|---|---|
| 0 | 0 | 1 | 2 | 3 | 4 | 5 | 6 |
| 1 | 6 | 0 | 1 | 2 | 3 | 4 | 5 |
| 2 | 5 | 6 | 0 | 1 | 2 | 3 | 4 |
| 3 | 4 | 5 | 6 | 0 | 1 | 2 | 3 |
| 4 | 3 | 4 | 5 | 6 | 0 | 1 | 2 |
| 5 | 2 | 3 | 4 | 5 | 6 | 0 | 1 |
| 6 | 1 | 2 | 3 | 4 | 5 | 6 | 0 |

The functions 'minr' and 'minc' (which are subtractions) are not associative, but they are distributive for both 'mul' and 'div'.

Figure 9:
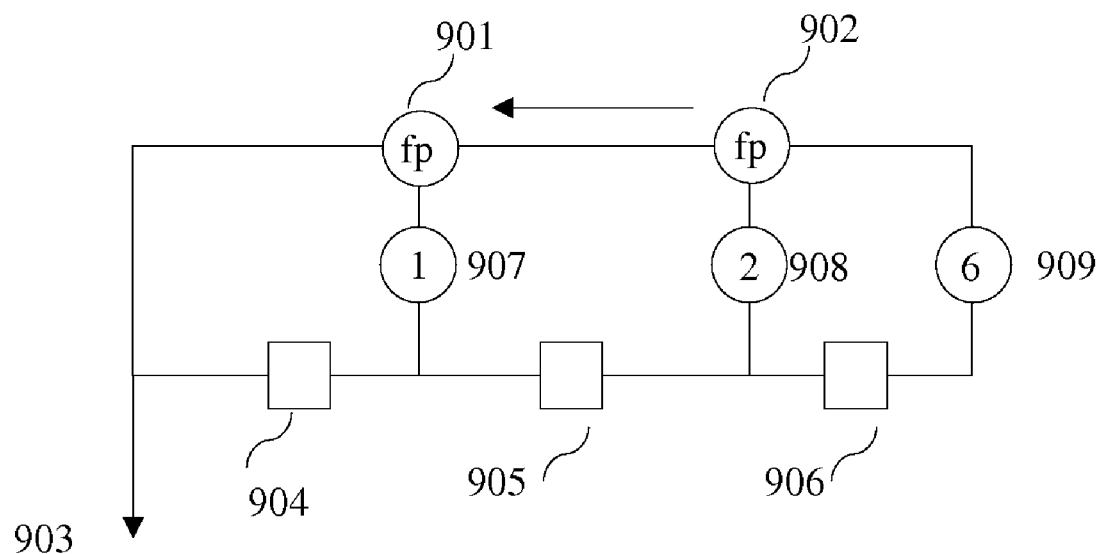
FIG. 9 is a diagram illustrating a Reed Solomon coder in Fibonacci configuration with multipliers.

FIG. 9 shows the Fibonacci configuration of the Reed-Solomon or RS(p,k) code generator for 7-valued symbols. The RS coder is a RS(7,3) coder with 7 symbols of which 3 are the information symbols. A codeword according to this RS(7,3) coder is generated by initiating the shift register with the 3 information symbols and generating 4 additional symbols by the LFSR of FIG. 9. It should be clear that one may also create 7-valued RS codewords generated by an Galois configuration, of which an illustrated example will be provided next.

Each codeword thus generated will have 7 7-valued symbols. Each of the possible 7*7*7=343 codewords has only 2 symbols in common in like positions of any other codeword. One way to find the correct configuration is by running all possible values for the multipliers and check if the generated codewords meet the requirement of having only 2 symbols in common. One configuration that will work has the multipliers [1 2 6] as shown in FIG. 9. The requirement of 2 symbols is needed to enable the correction of up to 2 errors in a codeword.

The following equations apply for generating a codeword [b4 b3 b2 b1 a3 a2 a1] with the coder of FIG. 9 with initial content [a3 a2 a1]. In the following equations 'fp' is the same as '+' and 'mul' is the same as
Generate symbol b1:

$t=2*a2+6*a1$; or $t=fp(2a2,6a1)$ $b1=a3+t$; or $b1=fp(a3,t)$

The notation fp(a3,t) may be more convenient for determining a reversing function. Generate symbol b2:

$t=2*a3+6*a2$ $b2=b1+t$

Generate symbol b3:

$t=2*b1+6*a3$ $b3=b2+t$

Generate symbol b4:

$t=2*b2+6*b1$ $b4=b3+t$

Using the arithmetic rules of GF(7) one can reconstruct the symbols in error applying pre-set assumptions and by considering all relevant assumptions. Because the code is an RS(7,3) code one can reconstruct 2 errors. For instance assume that 'b1' and 'a3' as adjacent symbols are in error. This means that it is assumed that 'b4', 'b3', 'b2', 'a2' and 'a1' are not in error. There are different ways to solve this problem. As an illustrative example the following steps are used:

$t=2*b2+6*b1$ $b4=b3+t$

So: $b4=fp(b3,t)$ or $t=minc(b3,b4)$.

$t=2b2+6b1$ or $6b1=minc(2b2,t)$

Dividing by 6 is multiplying by 6 or $b1=6*minc(2b2,t)$. For a3 the following is applied:

$t=2*b1+6*a3$ $b3=b2+t$ $b3=fp(b2,t)$ or $t=minc(b2,b3)$ $t=fp(2b1,6a3)$ or $6a3=minc(2b1,t)$ or $a3=6*minc(2b1,t)$.

A valid codeword generated by the RS(7,3) coder of FIG. 9 is [b4 b3 b2 b1 a3 a2 a1]=[1 3 0 2 1 4 0]. Applying this to the above equations will generate:
For b1: $t=minc(3,1)=5$
$b1=6*minc(2*0,5)=6*minc(0,5)=6*5=2$ (all in GF(7)).
Applying b1=2 to calculating a3:
$t=minc(b2,b3)=minc(0,3)=3$,
$a3=6*minc(2b1,t)=6*minc(2*2,3)=6*minc(4,3)=6*6=1$.

This confirms that b1 and a3 can be reconstructed from the other symbols. The Galois arithmetic method can also be applied to reconstruct assumed symbols in errors. The here provided example is intended to be illustrative to this method. One skilled in the art should be able to apply the method to other error assumptions as well to all other (p,k) Reed-Solomon codes.

A 7-Valued Galois Configuration

One can use the Galois configuration RS coder as provided in FIGS. 7 and 8 for a 7-valued example. In this example all functions and multipliers are 7-valued. The shift register elements can store and shift 7-valued symbols. All functions fp, fg1, fg2 and fg3 are the 7-valued function fp or adder over GF(7) as provided earlier. The multiplier 4 is the 7-valued multiplier 4 over GF(7) and was also provided earlier in a truth table. The following relations hold between the information symbols [a1 a2 a3] and the check symbols [b1 b2 b3 b4] generated by the coder of FIGS. 7 and 8:

$b1=a1+4a2+4a3$ $b2=6a1+5a2+a3$ $b3=2a2+a3$ $b4=4a1+2a2+a3$

One may check that all words [a1 a2 a3 b1 b2 b3 b4] generated with the 7-valued coder have at most 2 symbols in common in like positions, so each codeword meets the requirements of the RS-code.

From the above it should be clear that it is not really required to apply an LFSR to generate a codeword. One may also evaluate the n-valued expressions using the available information symbols to generate the check symbols as an aspect of the present invention. It should be clear that by using the earlier provided dividers (which by themselves are multipliers) one may solve above equations for assumed errors. For instance assuming that a1 and b1 are in error: from $b2=6a1+5a2+a3$ one may determine: $a1=6^{-1}(b2-(5a2+a3))$ Using valid codeword [6 6 6 5 2 4 0] one can determine from the above expression that a1 is indeed 6. One can determine the appropriate codeword from a set of calculated error corrected codewords by comparing a calculated codeword with a received codeword. If the calculated codeword and the received codeword have at least 5 symbols in common in like positions then the calculated codeword is a correct codeword and the information symbols in the calculated codewords are the correct information symbols.

For completeness the method of reversing functions, not using multipliers or n-valued inverters will also be illustrated.

Figure 10:
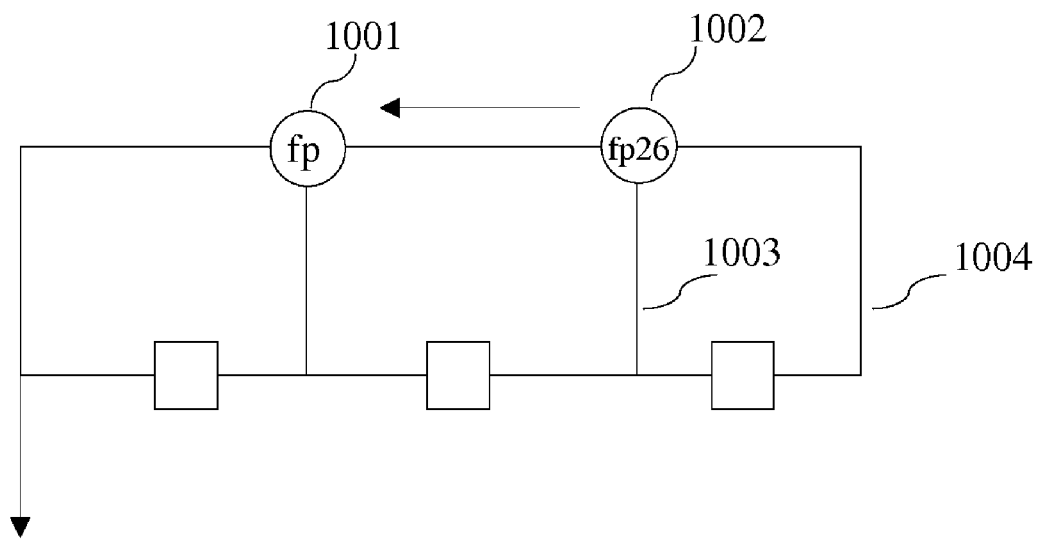
FIG. 10 is a diagram illustrating a Reed Solomon coder in Fibonacci configuration not having multipliers.

As shown in previous inventions by the inventor such as in the earlier cited U.S. patent application Ser. No. 10/935,960, which is incorporated herein by reference, it is possible to reduce a 2 input/single output n-valued function with n-valued multipliers or inverters at its inputs by a single 2 input/single output logic function having no inverters or multipliers. The equivalent Fibonacci configuration of the RS(p,k) code generator of FIG. 9 is shown in FIG. 10. The function fp (902 in FIG. 9) with multipliers 2 (908) and multiplier 6 (909) can be reduced to a single function fp26. The truth table of this 7-valued function is provided in the following truth table.

| fp26 | 0 | 1 | 2 | 3 | 4 | 5 | 6 |
|---|---|---|---|---|---|---|---|
| 0 | 0 | 6 | 5 | 4 | 3 | 2 | 1 |
| 1 | 2 | 1 | 0 | 6 | 5 | 4 | 3 |
| 2 | 4 | 3 | 2 | 1 | 0 | 6 | 5 |
| 3 | 6 | 5 | 4 | 3 | 2 | 1 | 0 |
| 4 | 1 | 0 | 6 | 5 | 4 | 3 | 2 |
| 5 | 3 | 2 | 1 | 0 | 6 | 5 | 4 |
| 6 | 5 | 4 | 3 | 2 | 1 | 0 | 6 |

The equivalent coder to the coder of FIG. 9 is shown in FIG. 10. The function fp26 1002 in FIG. 10 replaces function 902 and multipliers 908 and 909. The function fp26 is non-commutative so one should be careful in maintaining the correct order of inputs. For this function the rule is that of two inputs the right input (coming from the last shift register element in this) determines a column of the truth table.

The function fp 901 in FIG. 9 remains fp 1001 in FIG. 10 as the multiplier is a factor 1.

The following equations apply for generating [b4 b3 b2 b1 a3 a2 a1] with the coder of FIG. 10 when the initial state of the shift register is [a3 a2 a1].
For generating b1:

$t=fp26(a2,a1)$ $b1=fp(a3,t)$

For generating b2:

$t=fp26(a3,a2)$ $b2=fp(b1,t)$

For generating b3:

$t=fp26(b1,a3)$ $b3=fp(b2,t)$

For generating b4:

$t=fp26(b2,b1)$ $b4=fp(b3,t)$

Assume again that of [b4 b3 b2 b1 a3 a2 a1] the symbols b1 and a3 are in error. Accordingly one has to calculate the elements b1 and a3 using the assumed to be correct symbols b4, b3, b2, a2 and a1.

For calculating b1 one may use:

$t=fp26(b2,b1)$ $b4=fp(b3,t)$

From the last equation one may determine:
t=fprc(b3,b4). Herein 'fprc' is the reverse of function fp over the column, which is identical to the previously developed function 'minc'.
From t=fp26(b2,b1) one may then calculate: b1=fp26rc(b2,t), wherein 'fp26rc' is the reverse of function 'fp26' over the column. The truth table of 'fp26rc' is shown in the following truth table.

| fp26rc | 0 | 1 | 2 | 3 | 4 | 5 | 6 |
|---|---|---|---|---|---|---|---|
| 0 | 0 | 6 | 5 | 4 | 3 | 2 | 1 |
| 1 | 2 | 1 | 0 | 6 | 5 | 4 | 3 |
| 2 | 4 | 3 | 2 | 1 | 0 | 6 | 5 |
| 3 | 6 | 5 | 4 | 3 | 2 | 1 | 0 |
| 4 | 1 | 0 | 6 | 5 | 4 | 3 | 2 |
| 5 | 3 | 2 | 1 | 0 | 6 | 5 | 4 |
| 6 | 5 | 4 | 3 | 2 | 1 | 0 | 6 |

The truth table of fp26rc is identical to fp26. This means that fp26 is self reversing over the columns. This can be easily verified because all the rows of fp26 are self reversing 7-valued inverters.

Using the earlier [b4 b3 b2 b1 a3 a2 a1]=[1 3 0 2 1 4 0] will create: t=fprc(b3,b4) or t=minc(3,1)=5; and b1=fp26rc(b2, t)=fp26rc(0,5)=2. This of course agrees with the actual value of b1=2.
For calculating a3 one can use:

$$t=fp26(b1,a3)$$

$$b3=fp(b2,t)$$

Or t=minc(b2,b3)=minc(0,3)=3. And a3=fp26rc (b1,t)=fp26rc(2,3)=1. This is also correct.

One may repeat determining the calculated codewords under different assumptions of errors and compare these words with the original codeword. A calculated codeword with 5 or more symbols in common with the original codeword is the error corrected codeword. The methods of error correction by symbol reconstruction here provided according to different aspects of the present invention work for any Reed-Solomon code. One may either apply Galois arithmetic or reversing function methods.

The above method using reversing functions appears to be similar as the one using Galois arithmetic. However in case one uses reversible inverters in FIG. 9 which are not Galois Field multipliers the Galois arithmetic method may not work. One has to check if inverters and functions have distributive properties. One can still create reversible functions that will eliminate the inverters and will create a reduced configuration such as is shown in FIG. 10. Of course FIG. 10 is an illustrative example, and one can use a different n-valued logic, a different length shift register and different functions.

Figure 11:
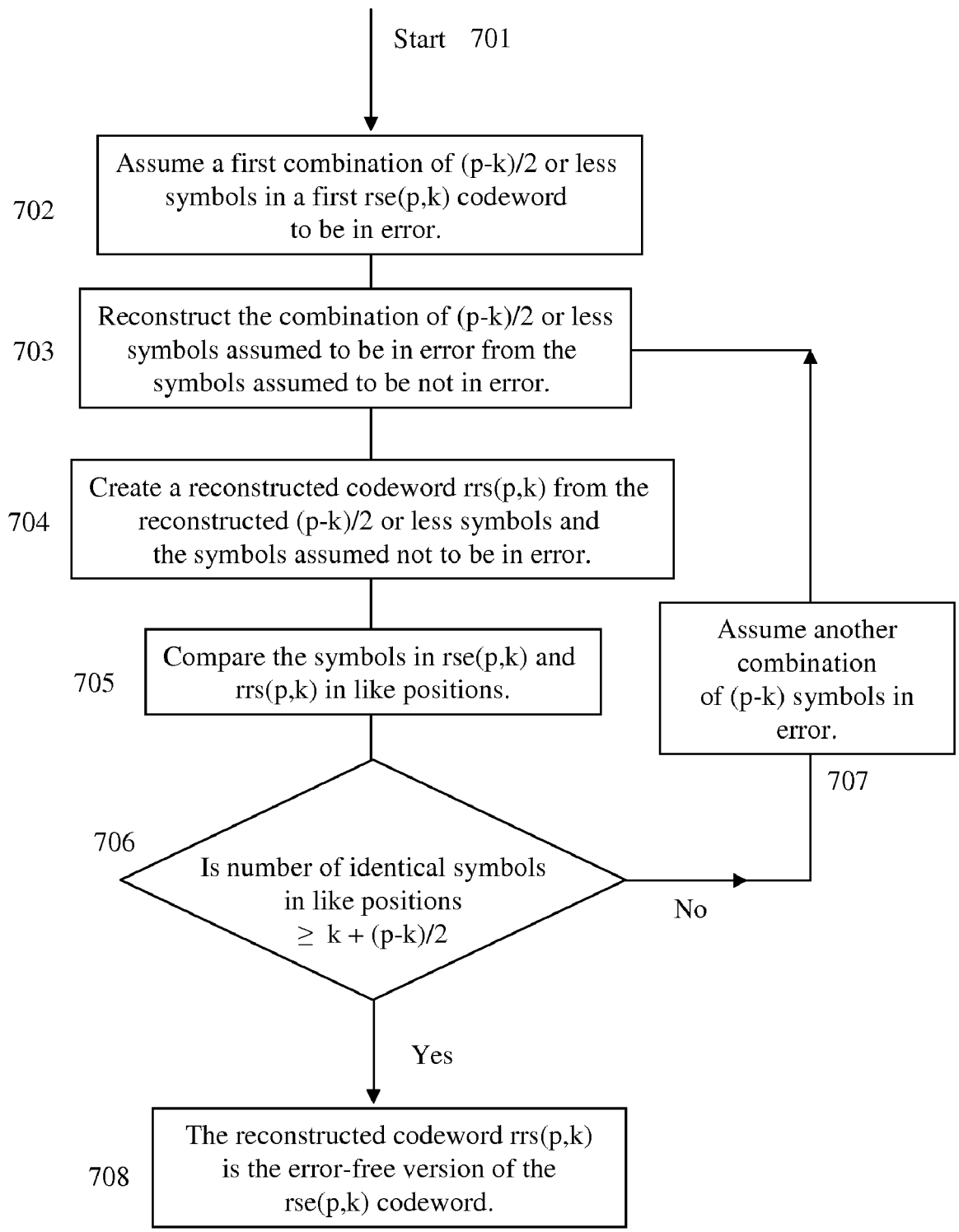
FIG. 11 is a flow diagram illustrating steps according to one aspect of the present invention.

It should further be clear that the here provided reconstruction methods according to one aspect of the present invention will work for any Reed-Solomon (p,k) or RS(p,k) code. The method of error-correcting symbols in a Reed-Solomon code of p symbols from k information symbols is shown in FIG. 11. The method starts at 701, after one checks the codeword rse(p,k) against a codeword RS(p,k) generated from the first k symbols of the codeword rse(p,k). If rse(p,k) and RS(p,k) are not identical then errors are present in rse(p,k). If rse(p,k) and RS(p,k) differ in (p−k)/2 symbols but the first k symbols of both codewords are identical then one may use these k symbols as the correct information symbols.

If the procedure enters at 701 one has detected errors of which at least one occurs in the information symbols. In step 702 one makes an assumption about the occurrence of the errors. This depends on the known distribution of the errors, for example is it known that errors occur in adjacent positions. Based on the length of a codeword one may also make 'smart' assumption about the errors. For instance errors may occur if adjacent at the beginning or end of a codeword. By making several assumptions one may limit the maximum number of cycles to reconstruct a codeword.

Based on the assumptions one can then reconstruct the symbols that were assumed to be in error by applying either the Galois arithmetic or the reversing logic functions from the symbols that are assumed to be error free in step 703. From those reconstructed symbols one can then create the reconstructed codeword rrs(p,k) in step 704. In step 705 one should determine the symbols in words rse(p,k) and rrs(p,k) in like positions to be identical.

In step 706 one determines if the number of identical symbols in like positions in rse(p,k) and rrs(p,k) is equal or greater than k+(p−k)/2. If the answer is yes one has then successfully reconstructed RS(p,k) for rse(p,k) and one can determine the k error-free information symbols in 708. If that is not the case then the assumption on the errors was wrong and in 707 one should assume a new combination of errors in rse(p,k) and repeat the process.

Figure 12:
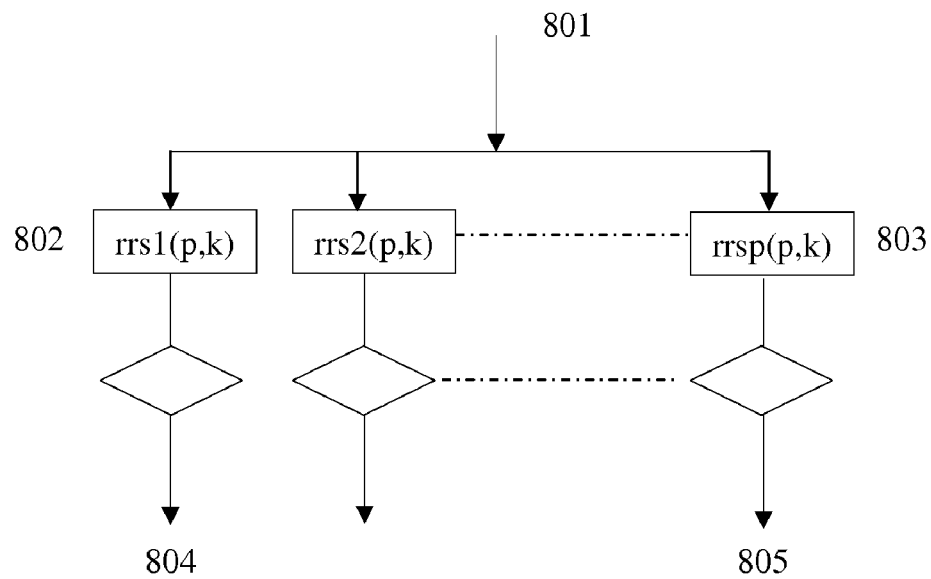
FIG. 12 is a flow diagram illustrating steps according to another aspect of the present invention.

In order to speed up the process one can create a system or a solution wherein all possible error combinations are evaluated in parallel. This is shown in FIG. 12. The elements of a received Reed-Solomon codeword with errors rse(p,k) are provided to p different units covering all relevant error combinations to generate all relevant reconstructed codewords ranging from rrs1(p,k) in 802 to rrsp(p,k) in 803. Within the constraints of the errors and the codewords at least one of the units will generate a codeword rrs(p,k) that has at least k+(p−k)/2 symbols in common with RS(p,k) in like or corresponding positions. There may actually be more than 1 codewords rrs(p,k), however they all will be identical. They appear at the outputs 804 to 805. All other outputs may generate for instance a signal 0.

In the earlier patent application Ser. No. 11/739,189 it was shown how truly cyclical codes can be generated by first generating an n-valued pseudo-random sequence (based on words of p n-valued symbols) and by extending each word by additional symbols generated by the method of the generated pn-sequence. For convenience this method of generating a codeword of p n-valued symbols of which k symbols are information symbols will be called a pn(p,k) method. This method is different from generating a RS(p,k) codeword for a Reed-Solomon code.

Generating pn(p,k) words in a Fibonacci configuration can be a continuous process. One may so to speak take for instance n consecutive symbols out of the n-valued sequence. If one uses the correct generating method as described in patent application Ser. No. 11/739,189 then one will generally find that each word of the selected pn(p,k) method has at most k symbols in common with each other pn(p,k) codeword. When (p−k)≧2*t+1 then one can error-correct without ambiguity t occurring errors.

An RS-code is comprised of a plurality of code-words; each codeword is comprised of a plurality of symbols. The symbols in general are n-valued, but are coded in binary symbols. Alternatively binary signals may be divided into series of binary words, wherein each binary word is comprised of more than 1 bit. A binary sequence may then be interpreted as representing a word comprised of a plurality of n-valued symbols.

Extending Error Correction for Reed Solomon Codes

The theory of Galois Field arithmetic is known to persons skilled in the art and does not need further explanation. The RS codes are usually written as (p,k) wherein n is the total number symbols in a word and k is the number of information symbols. In the present invention the letter n will be used for the radix or base of a logic. The letter p will be used to indicate the total number of symbols in a code word. There are k information symbols in a (p,k) code. Consequently there are (p−k) symbols that can be used to detect and/or correct errors. In essence the remainder that is attached to a code-word is an extension of the word formed by the information symbols so that the new word has an increased distance to all other valid code-words.

An important element of Reed-Solomon (p,k) error correcting coding is that each (p,k) codeword has at most (k−1) symbols in common with another codeword. (For efficiency reasons it is assumed that (p−k) is an even number.) That means that the distance of two codewords is (p−k+1). Assuming that (p−k)/2 errors have occurred that will create symbols in common the remaining distance is (p−k+1)−(p−k)/2. It also means that a codeword in error and its calculated correct codeword should at most differ only by (p−k)/2 symbols. Accordingly they have at least (p−(p−k)/2) symbols in common. Under assumption of (p−k)/2 errors one can then find the correct codeword by comparing the codeword in error with all possible (p,k) codewords. This is clearly not attractive for an Reed-Solomon (p,k) with a large number of codewords. Because the way Reed Solomon codes are constructed one has to first generate each codeword, or generate it and store it in order to make the comparison. Certainly for a smaller number of (p,k) codewords this method of comparing with all possible codewords can be potentially used.

As was stated before one can not create all RS codewords by starting with a single series of information symbols. While this is possible for the pn(p,k) method as shown in patent application Ser. No. 11/739,189, this does not work for RS codes. The advantage is that RS codewords have a "one symbol advantage" over pn(p,k) codes. It is another aspect of the present invention to extend the reach of the RS code in number of symbols. One can actually let the RS coder run for additional clock cycles and generate additional overhead symbols. Unfortunately in that situation the RS code in general loses its "one symbol advantage" as each codeword of the extended RS code usually has at maximum k symbols in common with each other codeword, rather than (k−1). This lowers the distance between codewords. However on the positive side the extended RS(p,k) code is no longer limited by the fact that p<n where n is the radix of the used symbol or of the n-valued logic. These codes were the subject of application Ser. No. 11/739,189.

Another extension is that one can actually generate RS codes that are RS(p+1,k) codes. Or in other words the codewords in these codes have for many codewords k−1 of (p+1) symbols in common. That means that one may sometimes actually correct up to 1+(p−k)/2 errors. One example for instance is a (8,3) 7-valued code generated with the generator of FIG. 9 with 7-valued multipliers 1, 4, and 5. The codewords thus generated at max only have 2 symbols in common.

Non Traditional Galois Field Reed Solomon Codes

It is another aspect of the present invention to extend the use of RS codes by using reversible inverters instead of multipliers. In most cases these inverters will not create a Galois Field, however they will create an RS (p,k) code of which a codeword has at most (k−1) symbols in common with another codeword. Galois Field arithmetic can then not be applied to reconstruct symbols in error. It should be clear that the method of reconstruction by the method of reversing functions which is one aspect of the present invention can be used for error correction in this case. The use of a reversible inverter that is not a Galois Field multiplier still leads to a reversible logic function according to the earlier cited patent application Ser. No. 10/935,960. This will be illustrated with the following 7-valued example.

Figure 13:
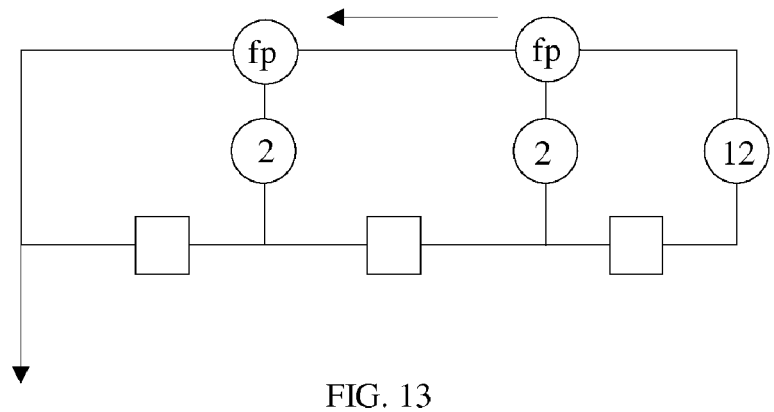
FIG. 13 is a diagram illustrating a Reed Solomon coder in Fibonacci configuration with multipliers and inverters.
Figure 13A:
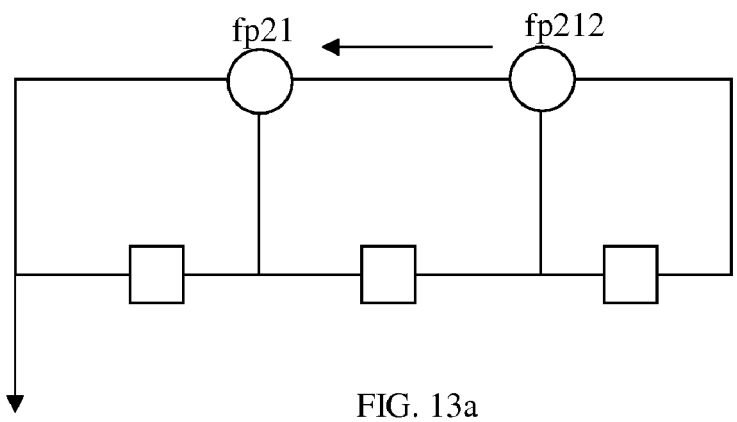
FIG. 13a is a diagram illustrating a Reed Solomon coder in Fibonacci configuration with no multipliers or inverters.

The following 7-valued reversible inverters will be introduced:
mul(8,:)=[2 1 0 6 5 4 3]
mul(12,:)=[6 5 4 3 2 1 0]
It should be understood that these inverters are from a list of 7! possible reversible 7-valued inverters. The numbers 8 and 12 are indicators and are of course not 7-valued numbers. One (7,3) Reed Solomon coder in Fibonacci configuration has the multipliers or inverters [2 2 12] and also using the 7-valued function fp. The 7-valued multipliers 0 to 7 were shown earlier in the truth table 'mul'. The RS coder in LFSR with multipliers/inverters is shown in FIG. 13. As before one can reduce the combination of inverter/function by a single function, in this case fp21 and fp212. The truth tables are provided in the following tables. The LFSR with the equivalent functions is shown in FIG. 13a.

| fp21 | 0 | 1 | 2 | 3 | 4 | 5 | 6 |
|---|---|---|---|---|---|---|---|
| 0 | 0 | 1 | 2 | 3 | 4 | 5 | 6 |
| 1 | 2 | 3 | 4 | 5 | 6 | 0 | 1 |
| 2 | 4 | 5 | 6 | 0 | 1 | 2 | 3 |
| 3 | 6 | 0 | 1 | 2 | 3 | 4 | 5 |
| 4 | 1 | 2 | 3 | 4 | 5 | 6 | 0 |
| 5 | 3 | 4 | 5 | 6 | 0 | 1 | 2 |
| 6 | 5 | 6 | 0 | 1 | 2 | 3 | 4 |

| fp212 | 0 | 1 | 2 | 3 | 4 | 5 | 6 |
|---|---|---|---|---|---|---|---|
| 0 | 6 | 5 | 4 | 3 | 2 | 1 | 0 |
| 1 | 1 | 0 | 6 | 5 | 4 | 3 | 2 |
| 2 | 3 | 2 | 1 | 0 | 6 | 5 | 4 |
| 3 | 5 | 4 | 3 | 2 | 1 | 0 | 6 |
| 4 | 0 | 6 | 5 | 4 | 3 | 2 | 1 |
| 5 | 2 | 1 | 0 | 6 | 5 | 4 | 3 |
| 6 | 4 | 3 | 2 | 1 | 0 | 6 | 5 |

For illustrative purposes the following table shows 10 3 symbol words coded as a (7,3) RS word and also as an (8,3) word by extending the word with 1 symbol.

| a1 | a2 | a3 | b1 | b2 | b3 | b4 | b5 |
|---|---|---|---|---|---|---|---|
| 0 | 0 | 1 | 1 | 3 | 6 | 2 | 5 |
| 1 | 0 | 1 | 0 | 1 | 0 | 1 | 0 |
| 2 | 0 | 1 | 6 | 6 | 1 | 0 | 2 |
| 3 | 0 | 1 | 5 | 4 | 2 | 6 | 4 |
| 4 | 0 | 1 | 4 | 2 | 3 | 5 | 6 |
| 5 | 0 | 1 | 3 | 0 | 4 | 4 | 1 |
| 6 | 0 | 1 | 2 | 5 | 5 | 3 | 3 |
| 0 | 1 | 1 | 3 | 6 | 2 | 5 | 0 |
| 1 | 1 | 1 | 2 | 4 | 3 | 4 | 2 |
| 2 | 1 | 1 | 1 | 2 | 4 | 3 | 4 |
| 3 | 1 | 1 | 0 | 0 | 5 | 2 | 6 |

One can check that each word has only 2 symbols in common in like positions.

Another example is wherein the multipliers [1 4 8] are used. One then applies the configuration of FIG. 13 with multipliers [2 2 12] from the 7-valued function 'mul' now replaced by [1 4 8]. This configuration can also be reduced to using only functions and no multipliers or inverters. For illustrative purposes the following table shows the (7,3) and (8,3) 10 codewords generated from the same 7-valued symbols words [a1 a2 a3] as before but with a different coder.

| a1 | a2 | a3 | b1 | b2 | b3 | b4 | b5 |
|----|----|----|----|----|----|----|----|
| 0  | 0  | 1  | 3  | 2  | 1  | 1  | 5  |
| 1  | 0  | 1  | 2  | 1  | 3  | 0  | 6  |
| 2  | 0  | 1  | 1  | 0  | 5  | 6  | 0  |
| 3  | 0  | 1  | 0  | 6  | 0  | 5  | 1  |
| 4  | 0  | 1  | 6  | 5  | 2  | 4  | 2  |
| 5  | 0  | 1  | 5  | 4  | 4  | 3  | 3  |
| 6  | 0  | 1  | 4  | 3  | 6  | 2  | 4  |
| 0  | 1  | 1  | 0  | 5  | 6  | 0  | 0  |
| 1  | 1  | 1  | 6  | 4  | 1  | 6  | 1  |
| 2  | 1  | 1  | 5  | 3  | 3  | 5  | 2  |
| 3  | 1  | 1  | 4  | 2  | 5  | 4  | 3  |

One can see that the codewords of both the (7,3) and (8,3) code have only 2 symbols in common in like positions. The codewords are different from the ones generated by using the previous multipliers. The here generated codes are Reed Solomon codes as they can be error corrected, if not with the Galois Fields methods or other methods they can be corrected with the reverse function method according to one aspect of the present invention. It should be clear that the shown coding methods using reversible inverters instead of Galois Field multipliers can be applied to all n-valued (p,k) Reed-Solomon type error correcting codes wherein p is prime or a number achieved by raising a prime to a power m wherein m is a positive integer.

Error Location

The here provided method of error location by assuming symbols in error, calculating a corrected word and determining the number of symbols in common in like positions between a received and a calculated corrected word is fast and can be executed in parallel for all assumptions. Traditionally the process of error correction in RS codes as provided for instance in the earlier cited book of Lin and Costello on page 242-252 and may comprise the following steps:
1. Compute the syndromes
2. Determine the error-location polynomial
3. Determine the error-value
4. Evaluate the error-location and error-value
5. Correct the errors A similar approach is also explained in the earlier cited article of Bernard Sklar and should be familiar to one of ordinary skill in the art. The fundamental background of the ability to solve errors is that the error corrupted codeword polynomial is a combination of the uncorrupted codeword polynomial and the error polynomial. The uncorrupted codeword polynomial is 0 for substituting the roots of a generator polynomial. One can find the syndromes by substituting the roots of the generator polynomial in the codeword polynomial. From the syndromes one can create the error location polynomial. By finding the roots of the error polynomial one has identified the location of the errors. Related approaches depending on syndrome calculations and error location polynomials exist of which an example is the well known Berlekamp-Massey algorithm.

If one is looking for a maximum number of errors it may actually be attractive to determine all relevant assumptions, calculate the related error calculated words and determine a valid error corrected word, instead of calculating all syndromes.

Another advantage is that location and corrected errors are determined at the same time in the methods here provided.

To demonstrate that the error location methods of the prior art can be used in the example the notation of the Sklar article will be used. The coder is provided in FIG. 14. This is equivalent to FIG. 9 on page 20 of the Sklar article. A signal [x3 x2 x1] is provided on input 1400, wherein the signal elements are provided from the right to the left. The initial state of the shift register is [0 0 0 0]. After entering [x3 x2 x1] the content of the shift register is [b1 b2 b3 b4]. The gate 1403 is made non-conducting after three clock cycles thus assumed to provide a symbol 0 and the content of the shift register is shifted out on output 1404 to output 1401 when a switch is set in the right position.

Herein the elements of the extended binary field GF(8) used are $\{0, \alpha^0, \alpha^1, \alpha^2, \alpha^3, \alpha^4, \alpha^5, \alpha^6\}$. The relations between elements of the field are provided by a primitive polynomial. The + and × operations are defined by the truth tables of FIG. 15 and FIG. 16. The + operation is self reversing, commutative and associative. The + and × operations are also distributive. The division ÷ or reverse of × is provided in the table of FIG. 17. Of importance are the columns in FIG. 17 which are the inverters of multipliers by a constant. It shows that the inverse of multiplying by $\alpha^0$ is itself; the inverse of multiplying by $\alpha^1$ is multiplying by $\alpha^6$; the inverse of multiplying by $\alpha^2$ is multiplying by $\alpha^5$; the inverse of multiplying by $\alpha^3$ is multiplying by $\alpha^4$; and of course the inverse of multiplying by $\alpha^4$ is multiplying by $\alpha^3$, the inverse of multiplying by $\alpha^5$ is multiplying by $\alpha^2$ and the inverse of multiplying by $\alpha^6$ is multiplying by $\alpha^1$ An aspect of the present invention is to provide the relationship between [b1 b2 b3 b4] and [x3 x2 x1]. These relations are:

$$b1 = \alpha^3 x3 + \alpha^6 x2 + \alpha^5 x1$$

$$b2 = \alpha^1 x3 + \alpha^6 x2 + \alpha^4 x1$$

$$b3 = \alpha^0 x3 + \alpha^0 x2 + \alpha^0 x1$$

$$b4 = \alpha^3 x3 + \alpha^2 x2 + \alpha^4 x3$$

One can check by using [x3 x2 x1]=$[\alpha^1\ \alpha^3\ \alpha^5]$ one will generate [b1 b2 b3 b4]=$[\alpha^0\ \alpha^2\ \alpha^4\ \alpha^6]$.

In the Sklar article an example is provided where the position of 2 symbols in error are calculated from the roots of an error location polynomial when x1 and b1 are in error. The next step in the known method is to calculate an error value.

It is an aspect of the present invention to calculate the correct symbol directly if it is known which symbols are in error. First of all b1 is a check symbol. One may calculate b1 for further checking purposes. However x1 is an information symbol and is really the critical symbol to solve. One may solve x1 from different equations of b2, b3, b4. Once x1 is solved one may solve b1.

Apply $b2 = \alpha^1 x3 + \alpha^6 x2 + \alpha^4 x1$. This equation can be rewritten as:
$\alpha^4 x1 = b2 + \alpha^1 x3 + \alpha^6 x2$ because + is self reversing. The operations are distributive, thus: $x1 = (\alpha^4)^{-1}(b2 + \alpha^1 x3 + \alpha^6 x2)$ or $x1 = \alpha^3(b2 + \alpha^1 x3 + \alpha^6 x2) = \alpha^3 b2 + \alpha^3 \alpha^1 x3 + \alpha^3 \alpha^6 x2$. By substituting $x2 = \alpha^3$, $x3 = \alpha^1$ and $b2 = \alpha^2$ and using the truth tables for + and × of FIG. 14 and FIG. 15 one finds that $x1 = \alpha^5$, which is of course the correct answer.

Slightly more involved is a calculation wherein two of the three information symbols are in error. However one skilled in the art can readily see that solving two equations with 2 unknowns can be easily achieved. For example assume that x1 and x2 in the Sklar example are determined to be in error by solving the roots of an error location polynomial. One can use the equations for b1 and b2 and add both:

$$b1 = \alpha^3 x3 + \alpha^6 x2 + \alpha^5 x1$$

$$b2 = \alpha^1 x3 + \alpha^6 x2 + \alpha^4 x1$$

$$(b1+b2) = (\alpha^1+\alpha^3)x3 + (\alpha^6+\alpha^6)x2 + (\alpha^4+\alpha^5)x1, \text{ or}$$

$$(b1+b2) = \alpha^0 x3 + \alpha^0 x1, \text{ or}$$

$$x1 = (\alpha^0)^{-1}(b1+b2+\alpha^0 x3), \text{ or}$$

Figure 18:
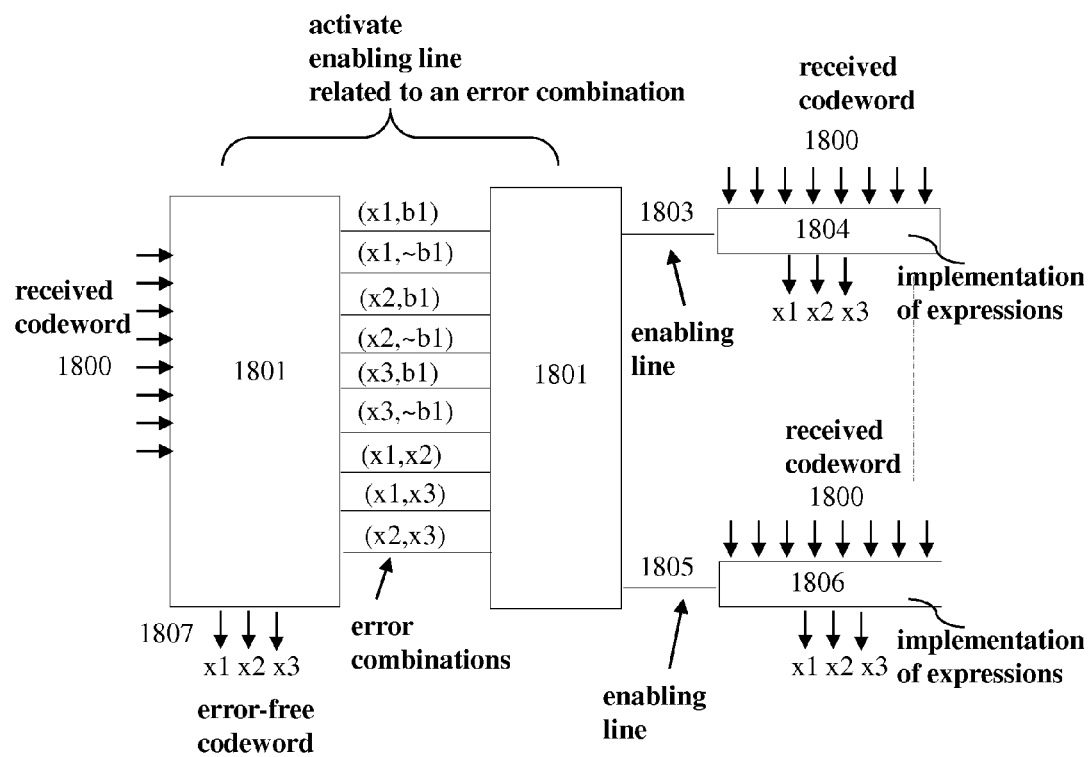
FIG. 18 is a diagram of a decoder in accordance with an aspect of the present invention.

$x1 = \alpha^0 b1 + \alpha^0 b2 + \alpha^0 x3$. Substituting the known, and correct, values for $b1$, $b2$ and $x3$ will provide $x1 = \alpha^5$. Etc. for $x2$ Accordingly one can provide the different expressions for calculating symbols in error when it is known which symbols are in error. An illustrative example how to generate the error corrected 3 symbols of a (7,3) error correcting RS code is provided in FIG. 18. Herein 1800 represent the received codeword of 7 symbols of which up to two symbols can be in error. The codeword is first provided to a unit 1801 that can determine an error polynomial. If no error in an information symbol is detected the unit 1801 provides the information symbols [x1 x2 x3] on an output 1807. If errors are detected in an information symbol the unit enables one of a plurality of output lines. Each line signifies a certain combination of errors. Each relevant combination is identified in FIG. 18. For instance the first line is enabled when x1 and b1 are detected in error. The second line is enabled when x1 and not b1 are in error. This situation covers if only x1 is in error or if x1 and for instance b2 are in error. In both situations x1 can be determined from the first equation related to b1. The other combinations are self explanatory.

An enabled line activates a unit that will execute the proper expressions, using error free symbols, to calculate the information symbol determined to be in error. For instance unit 1804 has as input the received codeword. Line 1803 when active enables 1804 to perform the necessary expressions and provides on an output the error corrected word [x1 x2 x3]. For clarity only the first unit 1804 and the last unit 1806, which is enabled by a line 1805 when x2 and x3 are in error, are shown.

One may for instance use a series of multiplexers controlled by enabling lines to provide on a final output the corrected information symbols [x1 x2 x3].

As one aspect of the present invention one may use existing error locating methods and calculate the corrected error. The methods of error correction can be implemented in general microprocessors or signal processors. The individual steps can also be realized as dedicated switching circuits and programmable circuits such as Programmable Arrays or Look-up Table methods. For smaller values of n in n-valued numbers one can apply dedicated n-valued switching devices. For large values of n one can also apply binary coded n-valued symbols and apply binary coded n-valued truth tables. In all situations one may represent an n-valued symbol by binary symbols. In all embodiments a processor is considered to be a circuit that can execute a step or more steps of a method provided as an aspect of the present invention. A program or software that executes a step of a method is considered herein to be first instructions saved and retrievable from a memory. Also a configuration of circuitry that executes a step of a method may be considered in the context of the present invention as a program or software. Even if such a step is hard wired it may be considered herein to be equivalent to a program or software.

There is a very wide field of application in error correcting coding, and especially in binary coded n-valued symbols. Aspects of the present invention can easily be applied in these areas, such as wireless and wired communication and in areas such as storage of data such as optical disks. Accordingly it is contemplated to use one or more aspects of the present invention in communication systems and in communication devices. One device that is specifically contemplated is a mobile phone. Another device using one or more aspects of the present invention is a wireless communication device for use in or with a computing device. A further device using one or more aspects of the present invention are devices or systems applying one of the IEEE 802 series of communication protocols. Another device contemplated for using one or more aspects of the present invention are data storage devices, such as magnetic, optical and magneto-optical storage devices. Bar coding devices are also contemplated.

Figure 19:
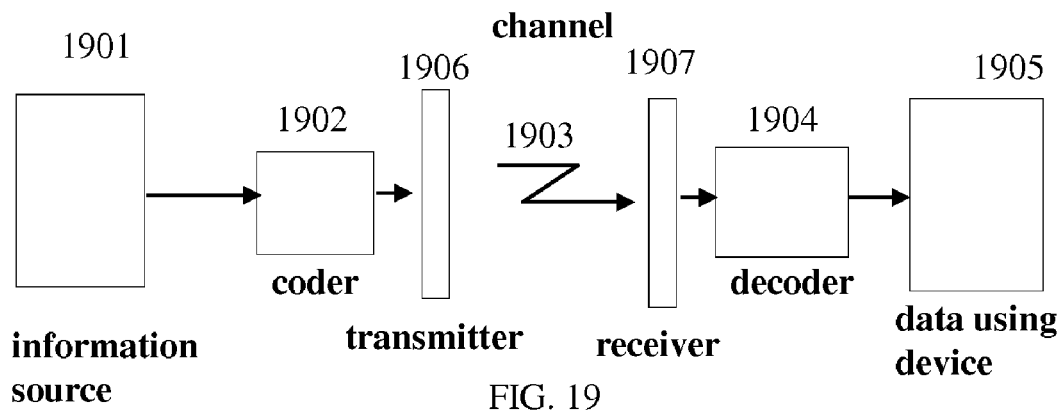
FIG. 19 is a diagram of a communication system in accordance with an aspect of the present invention.

In FIG. 19 a diagram of a communication system using methods of the present invention is provided. Herein an information source 1901 provides data that may be already transformed into digital representation and that may be audio, video, or any other type of data is provided to a coder 1902. The coder may chop up data in sequences of information data symbols of a fixed length of symbols. The coder then creates codewords by adding check symbols to information symbols in accordance with the rules of Reed Solomon coding. A thus formed RS codeword may be comprised of n-valued symbols or n-valued symbols represented by binary symbols. A RS codeword is then provided to a transmitter 1906. The transmitter may add further symbols for housekeeping purposes such as frame synchronization or other purposes. A transmitter may also provide other processing steps such as further coding. One additional step provided by the transmitter may be a modulation steps that conditions the RS codeword for transmission over a channel. When a codeword is ready for transmission it is provided for transmission over a channel 1903. This channel may be a wireless channel, such as a radio channel or an infrared optical channel. It may also be a wired channel such as coaxial or twisted cable. It may also be a wired optical channel of optical fiber, or any other transmission medium. The signal is then received, demodulated and readied for decoding by a receiver 1907 and provided to a decoder 1904, which will provide the error decoding steps as provided as aspects of the present invention. The error corrected data is then provided to a device 1905 which may use the data and for instance display it on a computer display, process it in a processor, play it as an audio signal or display it as a video signal.

Figure 20:
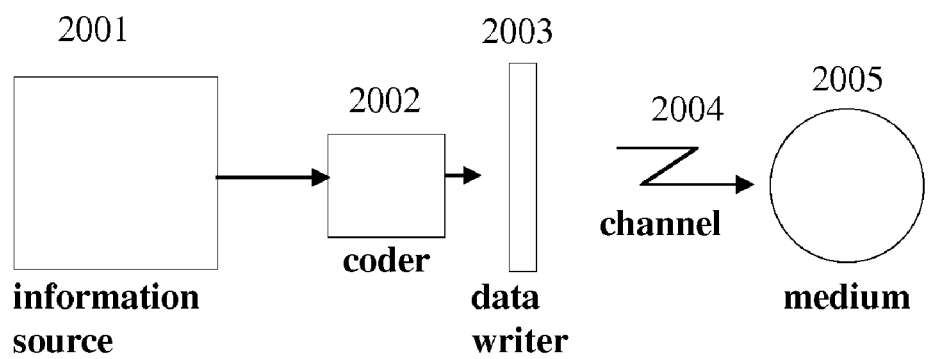
FIG. 20 is a diagram of a data storage system for writing data in accordance with an aspect of the present invention.
Figure 21:
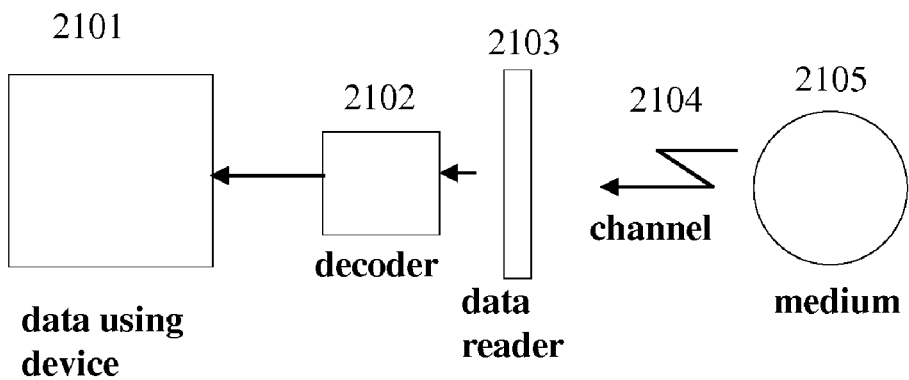
FIG. 21 is a diagram of a data storage system for reading data in accordance with an aspect of the present invention.

In FIG. 20 a diagram of a data storage system using methods of the present invention is provided to write data to a storage medium. Herein an information source 2001 provides data that may be already transformed into digital representation and that may be audio, video, or any other type of data is provided to a coder 2002. The coder may chop up data in sequences of information data symbols of a fixed length of symbols. The coder then creates codewords by adding check symbols to information symbols in accordance with the rules of Reed Solomon coding. A thus formed RS codeword may be comprised of n-valued symbols or n-valued symbols represented by binary symbols. A RS codeword is then provided to a writer 2003. The writer may add further symbols for housekeeping purposes such as frame synchronization or other purposes. A writer may also provide other processing steps such as further coding or signal shaping. One additional step provided by the writer may be a modulation steps that conditions the RS codeword for transmission over a channel. When a codeword is ready for writing it is provided for writing over a channel 2004 on a medium 2005. The signal may be an electrical, an optical, a magnetic or any other information carrying signal that can be used to transform a state of a medium 2005. For information retrieving a system as shown in diagram in FIG. 21 can be used. A reader 2103 through a channel 2104 reads a signal from a medium 2105. A reader may provide a reading signal to be able to read from a medium. For instance data stored on an optical disk may use a light source to read the stored data. The read data and retrieved RS codeword is then provided to the error correcting decoder 2102 that will perform the error correcting methods as disclosed herein. The error corrected data is then provided to a device 2101 that will process or display the data or play it for instance as an audio signal.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

The invention claimed is:

1. A method for decoding a (p,k) Reed-Solomon (RS) codeword having p n-valued symbols with n>2 and n being an integer, k of the p n-valued symbols being information symbols with p>1 and k>1, comprising evaluating a predetermined expression implemented on a processor, which contains at least one n-valued logic function defined by a truth table that determines an n-valued output symbol based on at least a first and a second n-valued input symbol and includes one or more n-valued symbols of the (p,k) Reed-Solomon (RS) codeword that are not in error as variables of which at least one is multiplied with an n-valued factor not being 0 or 1 and which generates a corrected n-valued symbol in the codeword, wherein each symbol is represented by a signal and wherein the predetermined expression is defined by at least one of a plurality of n-valued check symbol expressions with fixed n-valued coefficients and each n-valued check symbol expression in the plurality of n-valued check symbol expressions determines a value of an n-valued check symbol in the Reed-Solomon (RS) codeword.

2. The method as claimed in claim 1, further comprising:
determining a number of common n-valued symbols that a calculated codeword has in common with n-valued symbols in corresponding positions in the (p,k) RS codeword; and
determining the calculated codeword as a correct codeword if the number of common n-valued symbols is at least k+(p−k)/2.

3. The method as claimed in claim 1, further comprising selecting the predetermined expression from a plurality of predetermined expressions based on an n-valued symbol in the (p,k) RS codeword known to be in error.

4. The method as claimed in claim 1, further comprising correcting up to (p−k)/2 errors.

5. The method of claim 1, wherein n is a multiple of 2.

6. The method of claim 1, wherein an n-valued symbol is represented by one or more binary symbols.

7. The method of claim 1, further comprising:
creating a plurality of calculated codewords; and
selecting from the plurality of calculated codewords as a correct codeword a calculated codeword that has at least k+(p−k)/2 symbols in corresponding positions in common with the (p,k) RS codeword.

8. The method of claim 1, further comprising:
inputting k n-valued symbols on an n-valued Linear Feedback Shift Register (LFSR) having at least one n-valued logic function which is not an adder over GF(n);
outputting (p−k) n-valued symbols on an output of the LFSR; and
combining the k n-valued symbols with the (p−k) outputted n-valued symbols to form the (p,k) Reed-Solomon (RS) codeword with p n-valued symbols.

9. The method as claimed in claim 8, wherein the n-valued logic function in the LFSR is implemented by an adder over GF(n) with two inputs with an n-valued inverter at an input, the n-valued inverter not being a multiplier over GF(n).

10. The method as claimed in claim 8, wherein the applied LFSR is in Galois configuration.

11. An apparatus for decoding a (p,k) Reed Solomon (RS) codeword of p n-valued symbols with n>2 and n being an integer of which k n-valued symbols are information symbols with p>1 and k>1 with at least one n-valued symbol in error, including:
a processor enabled to execute instructions to perform a step:
the processor evaluating a predetermined expression which includes one or more n-valued symbols of the (p,k) RS codeword not in error as variables of which at least one is multiplied with an n-valued factor not being 0 or 1 and which generates a correct value of the at least one n-valued symbol in error in a calculated codeword, wherein each symbol is represented by a signal and wherein the predetermined expression is defined by at least one of a plurality of n-valued check symbol expressions with fixed n-valued coefficients and each n-valued check symbol expression in the plurality of n-valued check symbol expressions determines a value of an n-valued check symbol in the Reed-Solomon (RS) codeword.

12. The apparatus as claimed in claim 11, the processor further enabled to perform the steps:
determining a number of n-valued symbols that the calculated codeword has in common with n-valued symbols in corresponding positions in the (p,k) RS codeword; and
determining the calculated codeword as a correct codeword if the number of n-valued symbols is at least k+(p−k)/2.

13. The apparatus as claimed in claim 11, the processor further enabled to perform a step of selecting the predetermined expression from a plurality of predetermined expressions based on an n-valued symbol in the (p,k) RS codeword known to be in error.

14. The apparatus of claim 11, wherein n is a multiple of 2.

15. The apparatus of claim 11, wherein an n-valued symbol is represented by one or more binary symbols.

16. The apparatus of claim 11, the processor further enabled to perform the steps of:
creating a plurality of calculated codewords; and
selecting from the plurality of calculated codewords as a correct codeword a calculated codeword that has at least k+(p−k)/2 symbols in corresponding positions in common with the (p,k) RS codeword.

17. A system for decoding a (p,k) Reed-Solomon (RS) codeword having p n-valued symbols with n>2 and n being an integer of which k n-valued symbols are information symbols, comprising:
a processor enabled to execute instructions to perform a step:

evaluating a predetermined expression which includes only one or more n-valued symbols of the (p,k) Reed-Solomon (RS) codeword that are not in error as external variables of which at least one is multiplied with an n-valued factor not being 0 or 1 and which generates a corrected n-valued symbol in the codeword, wherein each symbol is represented by a signal and wherein the predetermined expression is defined by at least one of a plurality of n-valued check symbol expressions with fixed n-valued coefficients and each n-valued check symbol expression in the plurality of n-valued check symbol expressions determines a value of an n-valued check symbol in the Reed-Solomon (RS) codeword.

18. The system as claimed in claim 17, further comprising the processor enabled to execute instructions to perform a step selecting the n-valued logic expression from a plurality of expressions based on an n-valued symbol in the (p,k) RS codeword known to be in error.

19. The system as claimed in claim 17, further comprising the processor enabled to execute instructions to perform the steps:
  determining a number of common n-valued symbols that the calculated codeword has in common with n-valued symbols in corresponding positions in the (p,k) RS codeword; and
  determining the calculated codeword as the correct codeword if the number of common n-valued symbols is at least $k+(p-k)/2$.

20. The system as claimed in claim 17, wherein the system is a communication system.

21. The system as claimed in claim 17, wherein the system is a data storage system.

* * * * *